(12) United States Patent
Tsukamoto et al.

(10) Patent No.: US 10,658,607 B2
(45) Date of Patent: May 19, 2020

(54) LIGHT-EMITTING ELEMENT, DISPLAY DEVICE, METHOD FOR MANUFACTURING LIGHT-EMITTING ELEMENT, AND LIGHT EMISSION METHOD

(71) Applicant: Sharp Kabushiki Kaisha, Sakai, Osaka (JP)

(72) Inventors: Yuto Tsukamoto, Sakai (JP); Katsuhiro Kikuchi, Sakai (JP); Shinichi Kawato, Sakai (JP); Manabu Niboshi, Sakai (JP); Eiji Koike, Sakai (JP); Asae Ito, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/459,648

(22) Filed: Jul. 2, 2019

(65) Prior Publication Data
US 2019/0326540 A1 Oct. 24, 2019

Related U.S. Application Data

(63) Continuation of application No. 15/773,182, filed as application No. PCT/JP2016/082811 on Nov. 4, 2016, now Pat. No. 10,411,211.

(30) Foreign Application Priority Data

Nov. 10, 2015 (JP) .................. 2015-220754

(51) Int. Cl.
*H01L 51/50* (2006.01)
*H01L 51/56* (2006.01)

(52) U.S. Cl.
CPC .......... *H01L 51/5028* (2013.01); *H01L 51/50* (2013.01); *H01L 51/5004* (2013.01); *H01L 51/504* (2013.01); *H01L 51/5016* (2013.01); *H01L 51/56* (2013.01); *H01L 2251/552* (2013.01); *H01L 2251/558* (2013.01)

(58) Field of Classification Search
CPC ............ H01L 51/5028; H01L 51/5016; H01L 51/5004; H01L 51/504; H01L 51/56; H01L 51/50; H01L 2251/552; H01L 2251/558
See application file for complete search history.

(56) References Cited

U.S. PATENT DOCUMENTS

2012/0095226 A1* 4/2012 Inoue .................. C07F 15/0033
544/225

OTHER PUBLICATIONS

"Triplet fusion delayed fluorescence materials for OLEDs"; Yan-Ju Luo, Zhi-Yun Lu *, Yan Huang; College of Chemistry, Sichuan University, Chengdu 610064, China; Jun. 6, 2016.*
Tsukamoto el al., "Light-Emitting Element, Method for Manufacturing Same, and Light Emission Method", U.S. Appl. No. 15/773,182, filed May 3, 2018.

* cited by examiner

*Primary Examiner* — Jasmine J Clark
(74) *Attorney, Agent, or Firm* — Keating & Bennett, LLP

(57) ABSTRACT

An organic EL element (10) includes a first light-emitting layer (33*a*) having the shortest emission peak wavelength of a light-emitting layer (33) and containing a host material and a TTF material or at least the TTF material, a second light-emitting layer (33*b*) containing at least a TADF material, a third light-emitting layer (33*c*) having the longest emission peak wavelength of the light-emitting layer (33) and containing at least fluorescent material. The excited triplet level of the TTF material is lower than the excited triplet level of the TADF material.

20 Claims, 7 Drawing Sheets

LIGHT-EMITTING ELEMENT, DISPLAY DEVICE, METHOD FOR MANUFACTURING LIGHT-EMITTING ELEMENT, AND LIGHT EMISSION METHOD

TECHNICAL FIELD

The disclosure relates to a light-emitting element, a method for manufacturing the same, and a light emission method.

BACKGROUND ART

In recent years, a self-luminous display device using a light-emitting element (EL element) employing an electroluminescence (hereinafter referred to as "EL") phenomenon has been developed as a display device instead of a liquid crystal display device.

The light-emitting element employing the EL phenomenon can emit light at a voltage from several volts to several tens volts. The light-emitting element is a self-emitting element. Therefore, the light-emitting element has wide viewing angle and high viewability. Further, the light-emitting element is a complete solid element having a thin-film shape. Therefore, attention is attracted from the viewpoint of saving space and portability.

Since the light-emitting element is a surface light source, the light-emitting element is considered to be applied to a backlight of a liquid crystal display device or a light source of an illumination.

In recent years, the research and development of the light-emitting element employing the EL phenomenon have been actively made. The light-emitting element has a configuration in which a functional layer containing at least a light-emitting layer is provided between positive and negative electrodes. The light-emitting element emits light by using release of light during deactivation of excitons that are generated by injecting electrons ($e^-$) and holes ($h^+$) into the light-emitting layer and causing recombination.

To realize a high-resolution EL display device as a display device using such a light-emitting element, use of a white light-emitting element is effective. In the white light-emitting element, vapor deposition by selectively patterning vapor deposition using a fine vapor deposition mask is not needed.

CITATION LIST

Patent Literature

PTL 1: JP 2014-241405 A (published on Dec. 25, 2014).

SUMMARY

Technical Problem

In the white light-emitting element, a white tandem structure is widely used. In the white tandem structure, a plurality of EL elements are used at multiple states to achieve white light emission. The white tandem structure has problems in which the drive voltage is high and the efficiency is decreased due to carrier loss in an intermediate layer. Further, the white tandem structure has many layers and low productivity.

There is a light-emitting element having a white structure in which red (R), green (G), and blue (B) light-emitting layers (i.e., red light-emitting layer, green light-emitting layer, and blue light-emitting layer) are simply layered. In the light-emitting element, it is difficult to generate excitons over the red, green, and blue light-emitting layers and emit lights of three colors efficiently. Therefore, it is useful to use transfer of energy of excitons (excitation energy) to illuminate an adjacent layer. However, in this case, there is a need for overlapping of the emission spectrum of an excitation material with the absorption spectrum of an adjacent material. The energy transfer occurs only by a specific combination of the materials.

FIGS. 10A and 10B are each a view illustrating a problem of a known light-emitting element in which red, green, and blue light-emitting layers are simply layered.

In a light-emitting material, a ground-state ($S_0$) molecule absorbs optical energy to cause a transition from a Highest Occupied Molecular Orbital (HOMO) level to a Lowest Unoccupied Molecular Orbital (LUMO) level in the molecule, and excitation occurs.

An excited state includes a singlet excited state ($S_1$) in which the spin directions in the HOMO and the LUMO are parallel and a triplet excited state ($T_1$) in which the spin directions in the HOMO and the LUMO are antiparallel. Light emission from the singlet excited state is called fluorescence. Light emission from the triplet excited state is called phosphorescence.

Energy in a singlet excited state of a light-emitting material that exhibits blue (B) light emission (excited singlet level: hereinafter referred to as "$S_1$ level") is represented by $S_{1B}$, energy in a triplet excited state of the light-emitting material (excited triplet level: hereinafter referred to as "$T_1$ level") is represented by $T_{1B}$, the $S_1$ level of a light-emitting material that exhibits green (G) light emission is represented by $S_{1G}$, the $T_1$ level of the light-emitting material is represented by $T_{1G}$, the $S_1$ level of a light-emitting material that exhibits red (R) light emission is represented by $S_{1R}$, and the $T_1$ level of the light-emitting material is represented by $T_{1R}$. In this case, the energy level of each of the red, green, and blue light-emitting materials is increased in the order of $S_{1B} > S_{1G} > S_{1R}$ and $T_{1B} > T_{1G} > T_{1R}$, as illustrated in FIGS. 10A and 10B. Therefore, the energy transfer from the blue light-emitting layer to the green light-emitting layer and from the green light-emitting layer to the red light-emitting layer is likely to occur.

Accordingly, when excitons are generated in the green light-emitting layer, energy is transferred from the $S_{1G}$ level of the green light-emitting layer to the $S_{1R}$ level of the red light-emitting layer, as illustrated in FIG. 10A. However, energy is hardly transferred from the $S_{1G}$ level of the green light-emitting layer to the $S_{1B}$ level of the blue light-emitting layer.

A distance that energy can be transferred is restricted. This inhibits emission of lights of three colors. For example, when excitons are generated in the blue light-emitting layer, energy is transferred from the singlet excited state ($S_{1B}$) of the blue light-emitting layer to the singlet excited state ($S_{1G}$) of the green light-emitting layer, as illustrated in FIG. 10B. However, the energy is hardly transferred from the singlet excited state ($S_{1B}$) of the blue light-emitting layer to the singlet excited state ($S_{1R}$) of the red light-emitting layer.

Therefore, when the red, green, and blue light-emitting layers are simply layered, a layer in which light emission hardly occurs is produced regardless of the layering order.

A general light-emitting layer is formed from a two-component system including a host material for transporting holes and electrons and a dopant (guest) material for undergoing light emission. The dopant material is uniformly dispersed in the host material that is a main component.

In a process of generating excitons of a light-emitting element in which a light-emitting material is used as a dopant material, the probability of generating singlet excitons that are excitons in the singlet excited state is usually only 25%. At the remaining 75%, triplet excitons that are excitons in the triplet excited state are generated.

A transition from the singlet excited state to the ground state is a transition between states with the same spin multiplicity. However, a transition from the triplet excited state to the ground state is a transition between states with different spin multiplicities.

The transition from the triplet excited state to the ground state is a forbidden transition, and requires a long time. Therefore, the triplet excitons are not deactivated as light emission. The triplet excitons are converted into thermal energy or the like, and dissipated as heat. Thus, the triplet excitons do not contribute to light emission.

A general fluorescent material (fluorescence-emitting material) that emits fluorescence has many advantages such as excellent high-current density properties and selection diversity of material. However, the singlet excitons, of which the probability is 25%, can be only used in light emission.

Therefore, the development of a light-emitting element using a phosphorescent material (phosphorescent compound) that emits phosphorescence has been advanced in recent years (for example, see PTL 1).

FIGS. 11A and 11B are each a view illustrating the principle of light emission of the light-emitting element described in PTL 1.

PTL 1 discloses the light-emitting element that includes a first electrode, a first light-emitting layer over the first electrode, containing a first phosphorescent material and a first host material, a second light-emitting layer over the first light-emitting layer, containing a second phosphorescent material and a second host material, a third light-emitting layer over the second light-emitting layer, containing a third phosphorescent material and a third host material, and a second electrode over the third light-emitting layer. Among peaks of emission spectra of the first, second, and third phosphorescent materials, the peak of the emission spectrum of the phosphorescent material in the second light-emitting layer is on the longest wavelength side, and the peak of the emission spectrum of the phosphorescent material in the third light-emitting layer is on the shortest wavelength side. The third host material has higher triplet excitation energy than those of the first host material and the second host material.

According to PTL 1, as illustrated in FIG. 11A, the first light-emitting layer is a green light-emitting layer that exhibits green light emission (phosphorescence G), the second light-emitting layer is a red light-emitting layer that exhibits red light emission (phosphorescence R), the third light-emitting layer is a blue light-emitting layer that exhibits blue light emission (phosphorescence B), and the ratio of energy transfer from a $T_{1B}$ level of a phosphorescent material that emits blue light to a $T_{1R}$ level of a phosphorescent material that emits red light and a $T_{1G}$ level of a phosphorescent material that emits green light is controlled by utilizing a Förster transition (resonance transition), to emit lights of three colors with balance.

In PTL 1, the phosphorescent materials are dispersed in the host material, and the mixing ratios of the phosphorescent materials are decreased. Thus, the phosphorescent materials are isolated from each other by the host material. This makes it difficult to cause a Dexter transition (electron exchange interaction). Therefore, the energy transfer in PTL 1 is caused mainly by the Förster transition.

The Förster transition except for a transition from the triplet excited state to the triplet excited state is basically a spin forbidden transition. However, when a heavy element is contained like the phosphorescent material, spin reversal is caused by a spin orbit interaction as illustrated in FIG. 11B. Therefore, a transition from the singlet excited state to the singlet excited state is also allowed.

However, the phosphorescent material that emits blue light has problems in terms of color purity and lifetime. Further, since a heavy element such as iridium (Ir) is rare metal, there is a problem such as high cost. When excitons are generated in a fluorescent material, 75% of the excitons are transferred to the $T_1$ level that is non-emitting. When all these excitons are not subjected to energy transfer to another light-emitting material, the excitons are dissipated as thermal energy, and the efficiency is decreased.

The disclosure has been made in view of the problems described above. An object of the disclosure is to provide a three-color light-emitting element that allows each of light-emitting layers that are layered and have different emission peak wavelengths to efficiently emit light at low cost, a method for manufacturing the same, and a light emission method.

Solution to Problem

To solve the above-described problems, a light-emitting element according to one aspect of the disclosure is a light-emitting element including a first electrode, a second electrode, and a functional layer containing at least a first light-emitting layer, a second light-emitting layer, and a third light-emitting layer, the functional layer being disposed between the first and second electrodes. The first light-emitting layer has the shortest emission peak wavelength of the light-emitting layers and contains a host material and a TTF material that is a delayed fluorescent material that causes a TTF phenomenon in cooperation with the host material or by the TTF material alone, or contain at least the TTF material. The second light-emitting layer is layered on the first light-emitting layer between the first light-emitting layer and the third light-emitting layer. The second light-emitting layer contains at least a thermally activated delayed fluorescent material. The third light-emitting layer has the longest emission peak wavelength of the light-emitting layers and contains at least a fluorescent material. The excited triplet level of at least one of the host material and the TTF material contained in the first light-emitting layer is lower than the excited triplet level of the thermally activated delayed fluorescent material contained in the second light-emitting layer.

To solve the above-described problems, a method for manufacturing a light-emitting element according to one aspect of the disclosure includes forming a functional layer containing at least a light-emitting layer between first and second electrodes. The forming the functional layer includes forming a first light-emitting layer, forming a second light-emitting layer, and forming a third light-emitting layer. The first light-emitting layer has the shortest emission peak wavelength of the light-emitting layers and contains a host material and a TTF material that is a delayed fluorescent material that causes a TTF phenomenon in cooperation with the host material or by the TTF material alone, or contain at least the TTF material. The second light-emitting layer contains at least a thermally activated delayed fluorescent material. The excited triplet level of the thermally activated delayed fluorescent material is higher than the excited triplet level of at least one of the host material and the TTF material contained in the first light-emitting layer. The third light-emitting layer has the longest emission peak wavelength of the light-emitting layers and contains at least a fluorescent material. The formation of the first light-emitting layer and the formation of the second light-emitting layer are continuously performed such that the second light-emitting layer is layered between the first light-emitting layer and the third light-emitting layer and the first light-emitting layer and the second light-emitting layer are adjacent to each other.

To solve the above-described problems, a light emission method according to one aspect of the disclosure is a method including transferring the energy of excitons generated in a second light-emitting layer containing at least a thermally activated delayed fluorescent material to a first light-emitting layer by Dexter energy transfer, transferring the energy of excitons generated in the second light-emitting layer to a third light-emitting layer by Förster energy transfer to make the first, second, and third light-emitting layers to emit light. The first light-emitting layer is layered on the second light-emitting layer, has a shorter emission peak wavelength than that of the second light-emitting layer, and contains a host material and a TTF material that is a delayed fluorescent material that causes a TTF phenomenon in cooperation with the host material or by the TTF material alone, or at least the TTF material. The excited triplet level of at least one of the host material and the TTF material is lower than the excited triplet level of the thermally activated delayed fluorescent material. The third light-emitting layer is layered on the second light-emitting layer on a side opposite to the first light-emitting layer, has a longer emission peak wavelength than that of the second light-emitting layer, and contains a host material or a fluorescent material, or at least the fluorescent material.

Advantageous Effects of Invention

According to an aspect of the disclosure, a three-color light-emitting element that allows each of light-emitting layers that are layered and have different emission peak wavelengths to efficiently emit light at low cost, a method for manufacturing the same, and a light emission method can be provided.

DESCRIPTION OF EMBODIMENTS

Hereinafter, embodiments of the disclosure will be described in detail.

First Embodiment

One embodiment of the disclosure will be described hereinafter with reference to FIGS. 1A and 1B and 2.

Figure 1A:
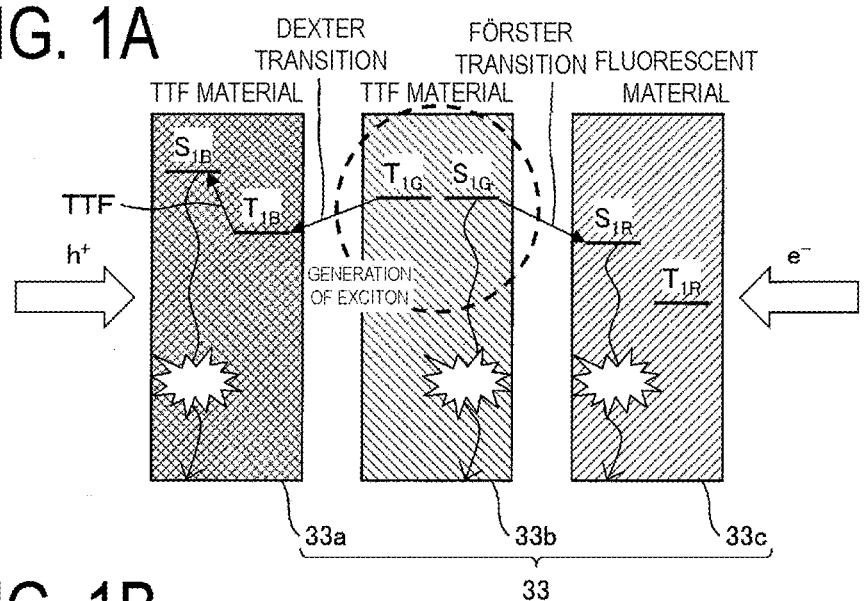
FIGS. 1A and 1B are views illustrating the principle of light emission of a light-emitting element according to a first embodiment of the disclosure.
Figure 1B:
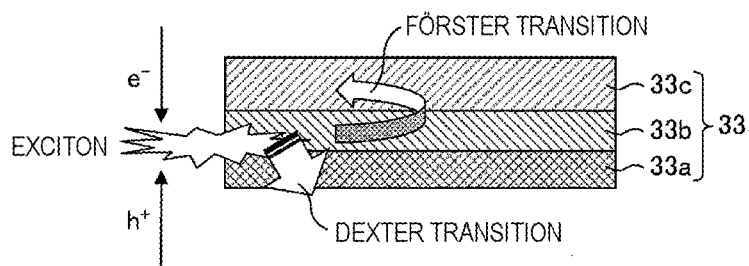

FIGS. 1A and 1B are views illustrating the principle of light emission of a light-emitting element according to the present embodiment. FIG. 2 is a cross-sectional view of an example of a schematic configuration of the light-emitting element according to the present embodiment.

In the light-emitting element according to the present embodiment, a functional layer containing at least a light-emitting layer is provided between first and second electrodes. The functional layer may be an organic layer or an inorganic layer. Hereinafter, an organic EL element will be described as an example of the light-emitting element according to the present embodiment.

Schematic Configuration of Organic EL Element

Figure 2:
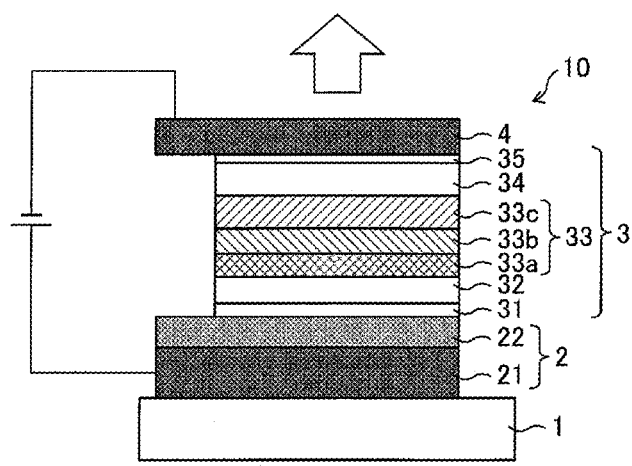
FIG. 2 is a cross-sectional view of an example of a schematic configuration of the light-emitting element according to the first embodiment of the disclosure.

As illustrated in FIG. 2, an organic EL element 10 according to the present embodiment has a configuration in which a positive electrode 2 (first electrode), an organic EL layer 3 (organic layer or functional layer), and a negative electrode 4 (second electrode) are layered on a substrate 1 in this order from the substrate 1 side.

The organic EL layer 3 is a light-emitting unit including an organic layer containing a light-emitting layer 33. The organic EL element 10 according to the present embodiment is a light-emitting device for illumination capable of white (W) display. The organic EL element 10 is a top-emitting organic EL element. In the organic EL element 10, light emitted from the light-emitting layer 33 is extracted as white light from a side opposite to the substrate 1.

Hereinafter, each of the components described above will be described in detail.

Substrate 1

The substrate 1 is not particularly limited as long as it has an insulating property. For example, a publicly known insulating substrate may be used.

As the substrate 1, for example, an inorganic substrate formed from glass or quartz or a plastic substrate formed from polyethylene terephthalate or a polyimide resin may be used.

In the present embodiment, a case where a glass substrate (transparent substrate) is used as an insulating substrate having a light-transmitting property will be described later as an example of the substrate 1. However, in the top-emitting organic EL element 10, the substrate 1 does not need a light-transmitting property as described above.

Therefore, when the organic EL element 10 is a top-emitting organic EL element, a semiconductor substrate such as a silicon wafer, a substrate in which a surface of a metal substrate formed from aluminum (Al) or iron (Fe) is coated with an insulating material such as silicon oxide and an organic insulating material, a substrate in which a surface of a metal substrate formed from Al is subjected to an insulation treatment by an anodic oxidation method, or the like may be used as the substrate 1.

On the substrate 1, a circuit including a drive element such as a TFT may be formed.

Positive Electrode 2 and Negative Electrode 4

The positive electrode 2 and the negative electrode 4 are a pair of electrodes. The positive electrode 2 functions as an electrode for injecting (supplying) holes ($h^+$) into the organic EL layer 3. On the other hand, the negative electrode 4 functions as an electrode for injecting (supplying) electrons ($e^-$) into the organic EL layer 3.

The shape, structure, and size of the positive electrode 2 and the negative electrode 4 are not particularly limited, and can be appropriately selected according to the application and purpose of the organic EL element 10.

Electrode materials capable of being employed for the positive electrode 2 and the negative electrode 4 are not particularly limited to a specific material, and, for example, a publicly known electrode material may be employed therefor.

For the positive electrode 2, for example, a metal such as gold (Au), platinum (Pt), and nickel (Ni), or a transparent electrode material such as indium tin oxide (ITO), tin oxide ($SnO_2$), indium tin oxide (IZO), and gallium doped zinc oxide (GZO) may be used.

On the other hand, it is preferable that a material having a small work function be used for the negative electrode 4 to inject electrons into the light-emitting layer 33. For the negative electrode 4, for example, a metal such as lithium (Li), calcium (Ca), cerium (Ce), barium (Ba), and aluminum (Al) or an alloy containing the metal, such as an Ag—Mg alloy and an Al—Li alloy may be used.

The thicknesses of the positive electrode 2 and the negative electrode 4 are not limited to a specific thickness, and may be set similar to those in a known EL element.

Light generated in the light-emitting layer 33 needs to be extracted from at least one of the positive electrode 2 and the negative electrode 4. In general, light is extracted from any one electrode side of the positive electrode 2 and the negative electrode 4. It is preferable that for an electrode in which light is extracted, a light-transmitting electrode material that transmits light be used, and for an electrode in which light is not extracted, a non-translucent electrode material that does not transmit light be used.

That is, various electrically conductive materials may be used for the positive electrode 2 and the negative electrode 4. However when the organic EL element 10 is a top-emitting EL element, it is preferable that an electrode on a side of the substrate 1 (in the present embodiment, the positive electrode 2) be formed from a non-translucent electrode material and an electrode on a side opposite to the substrate 1 with the organic EL layer 3 interposed between the electrode and the substrate 1 (in the present embodiment, the negative electrode 4) be formed from a transparent light-transmitting electrode material (transparent electrode) or a translucent light-transmitting electrode material (translucent electrode).

The positive electrode 2 and the negative electrode 4 may each have a single layer formed from one electrode material or a layered structure formed from a plurality of electrode materials.

Thus, when the organic EL element 10 is a top-emitting EL element as described above, the positive electrode 2 may have a layered structure including a non-translucent electrode 21 formed from a non-translucent electrode material, such as a reflective electrode, and a light-transmitting electrode 22 formed from a light-transmitting electrode material, as illustrated in FIG. 2.

Examples of the non-translucent electrode material include a black electrode material such as tantalum (Ta) and carbon (C), and a reflective metal electrode material such as Al, silver (Ag), gold (Au), an Al—Li alloy, an Al-neodymium (Nd) alloy, and an Al-silicon (Si) alloy.

As the light-transmitting electrode material, for example, a transparent electrode material described above may be employed, or a translucent electrode material such as a thin film of Ag may be used.

Organic EL Layer 3

As illustrated in FIG. 2, the organic EL layer 3 according to the present embodiment has a configuration in which a hole injecting layer 31, a hole transport layer 32, the light-emitting layer 33, an electron transport layer 34, and an electron injecting layer 35 are layered in this order from the positive electrode 2 side.

An organic EL layer other than the light-emitting layer 33 is not a layer necessary as the organic EL layer 3, and may be appropriately formed according to required properties of the organic EL element 10.

Light-Emitting Layer 33

The light-emitting layer 33 has a three-layer structure including a first light-emitting layer 33a (first light-emitting layer), a second light-emitting layer 33b (second light-emitting layer), and a third light-emitting layer 33c (third light-emitting layer).

The second light-emitting layer 33b is layered on the first light-emitting layer 33a between the first light-emitting layer 33a and the third light-emitting layer 33c. The organic EL element 10 according to the present embodiment has a simple structure in which a layer other than the light-emitting layers (intermediate layer) is not provided between the first light-emitting layer 33a, the second light-emitting layer 33b, and the third light-emitting layer 33c. Therefore, in the present embodiment, the second light-emitting layer 33b is disposed adjacent to both the first light-emitting layer 33a and the third light-emitting layer 33c between the first light-emitting layer 33a and the third light-emitting layer 33c. As described in an embodiment described later, an intermediate layer that does not contain an illuminant and has a higher $S_1$ level than the $S_1$ level of the third light-emitting layer 33c may be provided between the second light-emitting layer 33b and the third light-emitting layer 33c, and the second light-emitting layer 33b and the third light-emitting layer 33c do not need to be disposed adjacent to each other. In the present embodiment, the first light-emitting layer 33a, the second light-emitting layer 33b, and the third light-emitting layer 33c are layered in this order from the positive electrode 2 side.

Of the light-emitting layer 33, the first light-emitting layer 33a emits light having the shortest emission peak wavelength, the third light-emitting layer 33c emits light having the longest emission peak wavelength, and the second light-emitting layer 33b emits light having an emission peak wavelength that is from the emission peak wavelength of light in the first light-emitting layer 33a to the emission peak wavelength of light in the third light-emitting layer 33c.

In the present embodiment, as a light-emitting material, a phosphorescent material is not used, but a delayed fluorescent material is used for each of the first light-emitting layer 33a and the second light-emitting layer 33b. A fluorescent material containing at least two kinds of delayed fluorescent material (fluorescence-emitting material and phosphor) is used to perform white light emission by three-color light emission.

Therefore, in the present embodiment, for the first light-emitting layer 33a, a delayed fluorescent material that emits light having the shortest emission peak wavelength of the light-emitting materials used for the light-emitting layer 33 is used. For the third light-emitting layer 33c, a fluorescent material that emits light having the longest emission peak wavelength of the light-emitting material used for the light-emitting layer 33 is used. For the second light-emitting layer 33b, a delayed fluorescent material that emits light having an emission peak wavelength that is from the shortest emission peak wavelength to the longest emission peak wavelength is used.

The first light-emitting layer 33a, the second light-emitting layer 33b, and the third light-emitting layer 33c may be each formed from a host material and the fluorescent material, that is, a dopant material exhibiting fluorescence (light-emitting dopant and guest material), or from the dopant material alone. The host material is a compound in which holes and electrons can be injected, and has a function of allowing a light-emitting dopant to emit light by holes and electrodes that are transported and recombine with each other within a molecule thereof.

Hereinafter, in the present embodiment, a case where the first light-emitting layer 33a is a blue light-emitting layer (B fluorescent layer), the second light-emitting layer 33b is a green light-emitting layer (G fluorescent layer), and the third light-emitting layer 33c is a red light-emitting layer (R fluorescent layer) will be described as an example.

For the blue light-emitting layer, for example, a fluorescent material having a peak wavelength within a wavelength range from 380 nm to 480 nm is used. For the green light-emitting layer, for example, a fluorescent material having a peak wavelength within a wavelength range from 510 nm to 560 nm is used. For the red light-emitting layer, for example, a fluorescent material having a peak wavelength within a wavelength range from 600 nm to 680 nm is used.

First Light-Emitting Layer 33a

In the present embodiment, as the delayed fluorescent materials described above, a Triplet-Triplet-Fusion (TTF) material and a Thermally Activated Delayed Fluorescent (TADF) material are used.

For the first light-emitting layer 33a, the TTF material is used as the delayed fluorescent material described above. The first light-emitting layer 33a contains the host material (first host material) and the TTF material or at least the TTF material.

The TTF material is a delayed fluorescent material in which light emission can be achieved by re-excitation from the $T_1$ level to the $S_1$ level in cooperation with the host material or by the TTF material alone. In the delayed fluorescent material, a triplet-triplet phenomenon (also referred to as Triplet-Triplet Annihilation (TTA)) (hereinafter sometimes simply referred to as TTF) in which a singlet exciton is generated from a plurality of triplet excitons by collision and fusion of triplet excitons is caused, and as a result, light is emitted. It is considered that use of delayed fluorescence by the TTF phenomenon can theoretically enhance the internal quantum efficiency to 40% in fluorescent emission.

In the present embodiment, the TTF material in which upconversion from the $T_1$ level of the fluorescent material or the $T_1$ level of the host material to the $S_1$ level of the fluorescent material by TTF occurs to emit delayed fluorescence is used for the first light-emitting layer 33a.

When the first light-emitting layer 33a contains the host material and the dopant material including the fluorescent material, it is preferable that the triplet energy $E_{Th}$ of the host material be lower than the triplet energy $E_{Td}$ of the dopant material. When this relationship is satisfied, triplet excitons generated on the host material are not transferred to the dopant material that has a higher triplet energy, and triplet excitons generated on the dopant material are rapidly transferred to the host material as energy. Therefore, the triplet excitons of the host material are not transferred to the dopant material, and the triplet excitons efficiently collide with each other on the host material by the TTF phenomenon, to generate singlet excitons. Further, it is preferable that the singlet energy $E_{Sd}$ of the dopant material be lower than the singlet energy $E_{Sh}$ of the host material. When this relationship is satisfied, singlet excitons generated by the TTF phenomenon are transferred from the host material to the dopant material as energy. The singlet excitons contribute to fluorescent emission of the dopant material.

Herein, the triplet energy represents the lowest triplet state ($T_1$), that is, in the present embodiment, a difference between energy in $T_{1B}$ and energy in the ground state ($S_0$) in FIG. 1A. The singlet energy (also referred to as energy gap) represents the lowest singlet state ($S_1$), that is, in the present embodiment, a difference between energy in $S_{1B}$ and the energy in the ground state ($S_0$) in FIG. 1A.

In a dopant material used for a fluorescent element, a transition from the triplet excited state to the ground state is originally a forbidden transition. In such a transition, the triplet excitons are not deactivated as light emission. The triplet excitons are converted into thermal energy and dissipated as heat. Thus, the triplet excitons do not contribute to light emission.

However, when the host material and the dopant material satisfy the relationships described above, the triplet excitons collide with each other to efficiently generate the singlet excitons, before thermal deactivation, and the light-emitting efficiency is improved.

It is desirable that the affinity Ah of the host material be higher than the affinity Ad of the dopant material and the ionization potential Ih of the host material be higher than the ionization potential of the dopant material.

The affinity means energy to be released or absorbed when an electron is given to the molecule of the host material. In a case of release, the affinity is defined as positive, and in a case of absorption, the affinity is defined as negative.

The affinity of the host material or the dopant material is represented by Af=Ig−Eg, wherein Ip (Ih or Id) is an ionization potential of the host material or the dopant material, and Eg ($E_{Sh}$ or $E_{Sd}$) is a singlet energy thereof.

The dopant material used for the first light-emitting layer 33a is a fluorescent material having the shortest emission peak wavelength as described above. Specifically, a blue light-emitting phosphor that generates fluorescence having a peak wavelength within a wavelength range from 380 nm to 480 nm. The dopant material has a relatively large energy gap. Therefore, when the dopant material used for the first light-emitting layer 33a satisfies that Ah is higher than Ad, the dopant material also satisfies that Ih is higher than Id.

When a difference in ionization potential between the host material and the dopant material is larger, the dopant material has a hole-trapping property. In this case, the triplet excitons are generated not only on a host molecule (the host material) but also directly on a dopant molecule (the dopant material). When the relationship of $E_{Th} < E_{Td}$ is satisfied as described, the triplet exciton energy on the dopant molecules is transferred onto the host molecule by Dexter energy transfer (Dexter transition) due to an electron exchange interaction (i.e., Dexter mechanism). All the triplet excitons are collected on the host molecule. As a result, the TTF phenomenon occurs with efficiency.

For example, a combination of the host material and the dopant material (TTF material) that cause the TTF phenomenon can be selected from the following compounds.

Examples of the host material include an anthracene derivative and a polycyclic aromatic skeleton-containing compound. The host material may be used alone, or two or more kinds thereof may be appropriately used in combination.

Examples of the dopant material (TTF material) include a pyrene derivative such as an aminopyrene derivative, an aminoanthracene derivative, and aminochrysene derivative. The dopant material may be used alone, or two or more kinds thereof may be appropriately used in combination.

In particular, it is preferable that an anthracene derivative and at least one selected from an aminoanthracene derivative, an aminochrysene derivative, and an aminopyrene derivative be used as the host material and the dopant material, respectively, in combination. It is more preferable that an anthracene derivative and at least one selected from an aminochrysene derivative and an aminopyrene derivative be used as the host material and the dopant material, respectively, in combination.

Examples of the anthracene derivative used as the host material include a compound represented by Formula (1) below.

[Chemical Formula 1]

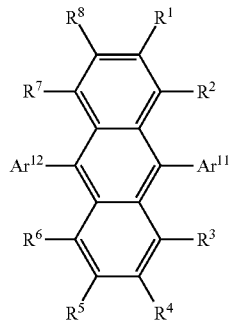

(1)

Such a compound is preferable.

In Formula (1), $Ar^{11}$ and $Ar^{12}$ are each independently a substituted or unsubstituted aryl group having from 6 to 50 ring-forming carbon atoms or a heterocyclic group having from 5 to 50 ring-forming atoms. $R^1$ to $R^8$ are each independently a group selected from a hydrogen atom, a substituted or unsubstituted aryl group having from 6 to 50 ring-forming carbon atoms, a substituted or unsubstituted heterocyclic group having from 5 to 50 ring-forming atoms, a substituted or unsubstituted alkyl group having from 1 to 50 carbon atoms, a substituted or unsubstituted cycloalkyl group having from 3 to 50 ring-forming carbon atoms, a substituted or unsubstituted alkoxy group having from 1 to 50 carbon atoms, a substituted or unsubstituted aralkyl group having from 7 to 50 carbon atoms, a substituted or unsubstituted aryloxy group having from 6 to 50 ring-forming carbon atoms, a substituted or unsubstituted arylthio group having from 6 to 50 ring-forming carbon atoms, a substituted or unsubstituted alkoxycarbonyl group having from 2 to 50 carbon atoms, a substituted or unsubstituted silyl group, a carboxyl group, a halogen atom, a cyano group, a nitro group and a hydroxyl group.

The anthracene derivative is not particularly limited, and may be appropriately selected according to the configuration and required properties of the used organic EL element 10.

Examples of the anthracene derivative used in the present embodiment include an anthracene derivative represented by Formula (1), wherein $Ar^{11}$ and $Ar^{12}$ are each independently a substituted or unsubstituted fused aryl group having from 10 to 50 ring-forming carbon atoms.

Such an anthracene derivative can include an anthracene derivative in which $Ar^{11}$ and $Ar^{12}$ are the same substituted or unsubstituted fused aryl group and an anthracene derivative in which $Ar^{11}$ and $Ar^{12}$ are different substituted or unsubstituted fused aryl groups.

Examples of the anthracene derivative in which $Ar^{11}$ and $Ar^{12}$ are the same substituted or unsubstituted fused aryl group include anthracene derivatives represented by Formulae (2) to (4) below.

[Chemical Formula 2]

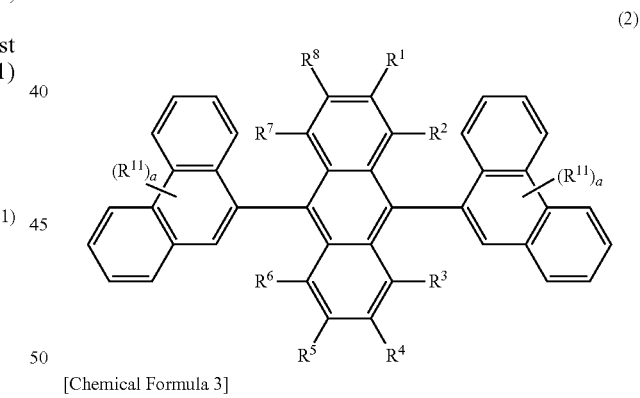

(2)

[Chemical Formula 3]

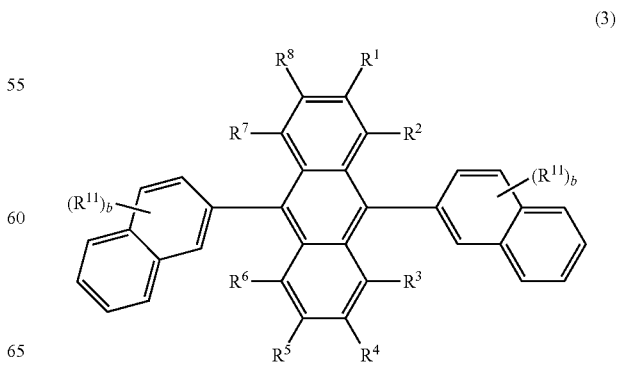

(3)

-continued

[Chemical Formula 4]

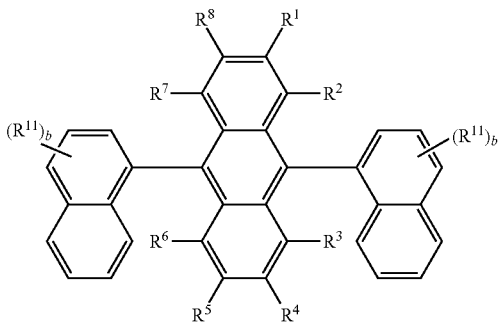

(4)

Such derivatives are used as the anthracene derivative.

In the anthracene derivative represented by Formula (2), $Ar^{11}$ and $Ar^{12}$ are a substituted or unsubstituted 9-phenanthrenyl group. In Formula (2), $R^1$ to $R^8$ are as defined above. $R^{11}$ is a group selected from a hydrogen atom, a substituted or unsubstituted aryl group having from 6 to 50 ring-forming carbon atoms, a substituted or unsubstituted heterocyclic group having from 5 to 50 ring-forming atoms, a substituted or unsubstituted alkyl group having from 1 to 50 carbon atoms, a substituted or unsubstituted cycloalkyl group having from 3 to 50 ring-forming carbon atoms, a substituted or unsubstituted alkoxy group having from 1 to 50 carbon atoms, a substituted or unsubstituted aralkyl group having from 7 to 50 carbon atoms, a substituted or unsubstituted aryloxy group having from 6 to 50 ring-forming carbon atoms, a substituted or unsubstituted arylthio group having from 6 to 50 ring-forming carbon atoms, a substituted or unsubstituted alkoxycarbonyl group having from 2 to 50 carbon atoms, a substituted or unsubstituted silyl group, a carboxyl group, a halogen atom, a cyano group, a nitro group, and a hydroxyl group. a is an integer from 0 to 9. When a is an integer of not less than 2, $R^{11}$s may be the same as or different from each other as long as two substituted or unsubstituted phenanthrenyl groups are the same.

In the anthracene derivative represented by Formula (3), $Ar^{11}$ and $Ar^{12}$ in Formula (1) are a substituted or unsubstituted 2-naphthyl group. In Formula (3), $R^1$ to $R^8$ and $R^{11}$ are as defined above. b is an integer from 1 to 7. When b is an integer of not less than 2, $R^{11}$s may be the same as or different from each other as long as two substituted or unsubstituted 2-naphthyl groups are the same.

In the anthracene derivative represented by Formula (4), $Ar^{11}$ and $Ar^{12}$ in Formula (1) are a substituted or unsubstituted 1-naphthyl group. In Formula (4), $R^1$ to $R^8$, $R^{11}$, and b are as defined above. When b is an integer of not less than 2, $R^{11}$s may be the same as or different from each other as long as two substituted or unsubstituted 1-naphthyl groups are the same.

Examples of the anthracene derivative represented by Formula (1), wherein $Ar^{11}$ and $Ar^{12}$ are different substituted or unsubstituted fused aryl groups include anthracene derivatives in which $Ar^{11}$ and $Ar^{12}$ are a substituted or unsubstituted 9-phenanthrenyl group, a substituted or unsubstituted 1-naphthyl group, or a substituted or unsubstituted 2-naphthyl group.

Specific examples thereof include an anthracene derivative in which $Ar^{11}$ is a 1-naphthyl group and $Ar^{12}$ is a 2-naphthyl group, an anthracene derivative in which $Ar^{11}$ is a 1-naphthyl group and $Ar^{12}$ is a 9-phenanthryl group, and an anthracene derivative in which $Ar^{11}$ is a 2-naphthyl group and $Ar^{12}$ is a 9-phenanthryl group.

The anthracene derivative used in the present embodiment may be an anthracene derivative represented by Formula (1), wherein one of $Ar^{11}$ and $Ar^{12}$ is a substituted or unsubstituted phenyl group and the other is a substituted or unsubstituted fused aryl group having from 10 to 50 fused aryl groups.

Examples of such an anthracene derivative include anthracene derivatives represented by Formulae (5) and (6) below.

[Chemical Formula 5]

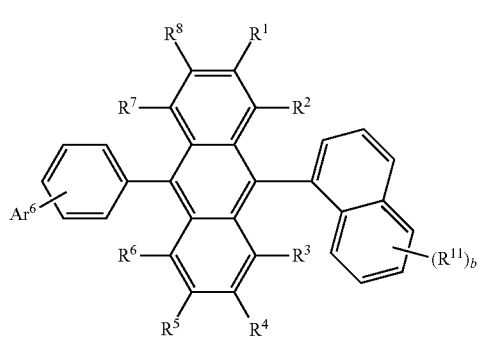

(5)

[Chemical Formula 6]

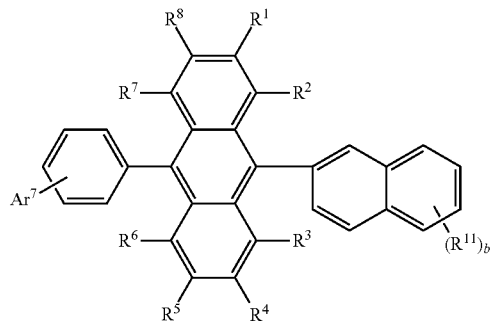

(6)

Such derivatives are used as the anthracene derivative.

In the anthracene derivative represented by Formula (5), $Ar^{11}$ in Formula (1) is a substituted or unsubstituted 1-naphthyl group and $Ar^{12}$ in Formula (1) is a substituted or unsubstituted phenyl group. In Formula (5), $R^1$ to $R^8$, $R^{11}$, and b are as defined above. $Ar^6$ is a substituted or unsubstituted aryl group having from 6 to 50 ring-forming carbon atoms, a substituted or unsubstituted alkyl group having from 1 to 50 carbon atoms, a substituted or unsubstituted cycloalkyl group having from 3 to 50 ring-forming carbon atoms, a substituted or unsubstituted aralkyl group having from 7 to 50 carbon atoms, a substituted or unsubstituted heterocyclic group having from 5 to 50 ring-forming atoms, a 9,9-dimethylfluoren-1-yl group, a 9,9-dimethylfluoren-2-yl group, a 9,9-dimethylfluoren-3-yl group, a 9,9-dimethylfluoren-4-yl group, a dibenzofuran-1-yl group, a dibenzofuran-2-yl group, a dibenzofuran-3-yl group, or a dibenzofuran-4-yl group. $Ar^6$ may form a ring, such as a substituted or unsubstituted fluorenyl group, or a substituted or unsubstituted dibenzofuranyl group, with a benzene ring to which $Ar^6$ is bonded. When b is an integer of not less than 2, $R^{11}$s may be the same as or different from each other.

In the anthracene derivative represented by Formula (6), $Ar^{11}$ in Formula (1) is a substituted or unsubstituted 2-naphthyl group and $Ar^{12}$ is a substituted or unsubstituted phenyl group. In Formula (6), $R^1$ to $R^8$, $R^{11}$, and b are as defined above. $Ar^7$ is a substituted or unsubstituted aryl group having from 6 to 50 ring-forming carbon atoms, a substituted or unsubstituted heterocyclic group having from 5 to 50 ring-forming atoms, a substituted or unsubstituted alkyl group having from 1 to 50 carbon atoms, a substituted or unsubstituted cycloalkyl group having from 3 to 50 ring-forming carbon atoms, a substituted or unsubstituted aralkyl group having from 7 to 50 carbon atoms, a dibenzofuran-1-yl group, a dibenzofuran-2-yl group, a dibenzofuran-3-yl group, or a dibenzofuran-4-yl group. $Ar^7$ may form a ring, such as a substituted or unsubstituted fluorenyl group, or a substituted or unsubstituted dibenzofuranyl group, with a benzene ring to which $Ar^7$ is bonded. When b is an integer of not less than 2, $R^{11}$s may be the same as or different from each other.

The anthracene derivative used in the present embodiment may be, for example, an anthracene derivative represented by Formula (7) below.

[Chemical Formula 7]

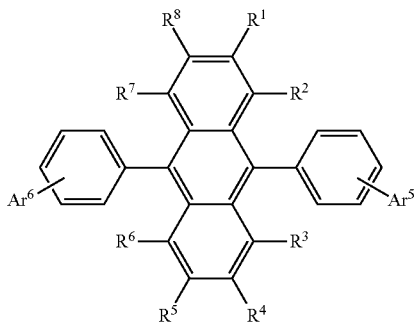

(7)

Such an anthracene derivative may be used in the present embodiment.

In Formula (7), $R^1$ to $R^8$ and $Ar^6$ are as defined above. $Ar^5$ is a substituted or unsubstituted aryl group having from 6 to 50 ring-forming carbon atoms, a substituted or unsubstituted alkyl group having from 1 to 50 carbon atoms, a substituted or unsubstituted cycloalkyl group having from 3 to 50 ring-forming carbon atoms, a substituted or unsubstituted aralkyl group having from 7 to 50 carbon atoms, or a substituted or unsubstituted heterocyclic group having from 5 to 50 ring-forming atoms. $Ar^5$ and $Ar^6$ are each independently selected.

Examples of such an anthracene derivative include anthracene derivatives represented by Formulae (8) to (10) below.

[Chemical Formula 8]

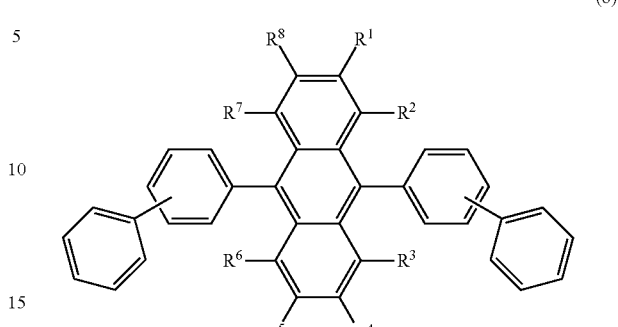

(8)

[Chemical Formula 9]

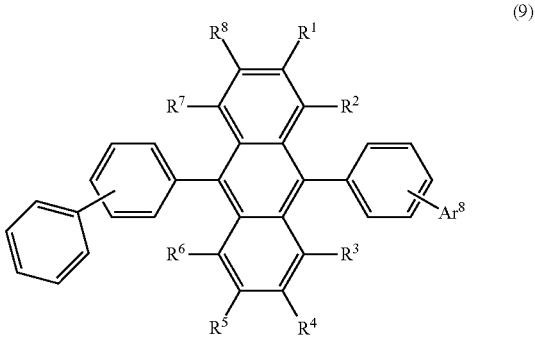

(9)

[Chemical Formula 10]

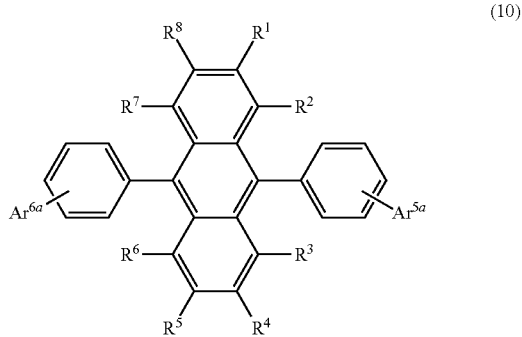

(10)

Such anthracene derivatives are used in the present embodiment.

In Formulae (8) to (10), $R^1$ to $R^8$ are as defined above.

In Formula (9), $Ar^8$ is a substituted or unsubstituted fused aryl group having from 10 to 20 ring-forming carbon atoms.

In Formula (10), $Ar^{5a}$ and $Ar^{6a}$ are each independently a substituted or unsubstituted fused aryl group having from 10 to 20 ring-forming carbon atoms.

Examples of the substituted or unsubstituted aryl groups having from 6 to 50 ring-forming carbon atoms of $R^1$ to $R^8$, $R^{11}$, $Ar^5$ to $Ar^7$, $Ar^{11}$, and $Ar^{12}$ in Formulae (1) to (10) include a phenyl group, a 1-naphthyl group, a 2-naphthyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a 6-chrysenyl group, a 1-benzo[c]phenanthryl group, a 2-benzo[c]phenanthryl group, a 3-benzo[c]phenanthryl group, a 4-benzo[c]phenanthryl group, a 5-benzo[c]phenanthryl group, a 6-benzo[c]phenanthryl group, a 1-benzo[g]chrysenyl group, a 2-benzo[g]

chrysenyl group, a 3-benzo[g]chrysenyl group, a 4-benzo[g]chrysenyl group, a 5-benzo[g]chrysenyl group, a 6-benzo[g]chrysenyl group, a 7-benzo[g]chrysenyl group, a 8-benzo[g]chrysenyl group, a 9-benzo[g]chrysenyl group, a 10-benzo[g]chrysenyl group, a 1-benzo[g]chrysenyl group, a 12-benzo[g]chrysenyl group, a 13-benzo[g]chrysenyl group, a 14-benzo[g]chrysenyl group, a 1-triphenyl group, a 2-triphenyl group, a 2-fluorenyl group, a 9,9-dimethylfluoren-2-yl group, a benzofluorenyl group, a dibenzofluorenyl group, a 2-biphenylyl group, a 3-biphenylyl group, a 4-biphenylyl group, a p-terphenyl-4-yl group, a p-terphenyl-3-yl group, a p-terphenyl-2-yl group, a m-terphenyl-4-yl group, a m-terphenyl-3-yl group, a m-terphenyl-2-yl group, an o-tolyl group, an m-tolyl group, a p-tolyl group, a p-t-butylphenyl group, a p-(2-phenylpropyl)phenyl group, a 3-methyl-2-naphthyl group, a 4-methyl-1-naphthyl group, a 4-methyl-1-anthryl group, a 4'-methylbiphenyl group, and a 4"-t-butyl-p-terphenyl-4-yl group. Among these, an unsubstituted phenyl group, a substituted phenyl group, a substituted or unsubstituted aryl group having from 10 to 14 ring-forming carbon atoms (e.g., a 1-naphthyl group, a 2-naphthyl group, and a 9-phenanthryl group), a substituted or unsubstituted fluorenyl group (a 2-fluorenyl), and a substituted or unsubstituted pyrenyl group (a 1-pyrenyl group, 2-pyrenyl group, and 4-pyrenyl group) are preferable.

Examples of the substituted or unsubstituted fused aryl groups having from 10 to 20 ring-forming carbon atoms of $Ar^{5a}$, $Ar^{6a}$, and $Ar^8$ include a 1-naphthyl group, a 2-naphthyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, and a 2-fluorenyl group. Among these, a 1-naphthyl group, a 2-naphthyl group, a 9-phenanthryl group, and a fluorenyl group (a 2-fluorenyl group) are preferable.

Examples of the substituted or unsubstituted heterocyclic groups having from 5 to 50 ring-forming atoms of $R^1$ to $R^8$, $R^{11}$, $Ar^5$ to $Ar^7$, $Ar^{11}$, and $Ar^{12}$ include a 1-pyrrolyl group, a 2-pyrrolyl group, a 3-pyrrolyl group, a pyrazinyl group, a 2-pyridinyl group, a 3-pyridinyl group, a 4-pyridinyl group, a 1-indolyl group, a 2-indolyl group, a 3-indolyl group, a 4-indolyl group, a 5-indolyl group, a 6-indolyl group, a 7-indolyl group, a 1-isoindolyl group, a 2-isoindolyl group, a 3-isoindolyl group, a 4-isoindolyl group, a 5-isoindolyl group, a 6-isoindolyl group, a 7-isoindolyl group, a 2-furyl group, a 3-furyl group, a 2-benzofuranyl group, a 3-benzofuranyl group, a 4-benzofuranyl group, a 5-benzofuranyl group, a 6-benzofuranyl group, a 7-benzofuranyl group, a 1-isobenzofuranyl group, a 3-isobenzofuranyl group, a 4-isobenzofuranyl group, a 5-isobenzofuranyl group, a 6-isobenzofuranyl group, a 7-isobenzofuranyl group, a 1-dibenzofuranyl group, a 2-dibenzofuranyl group, a 3-dibenzofuranyl group, a 4-dibenzofuranyl group, a 1-dibenzothiophenyl group, a 2-dibenzothiophenyl group, a 3-dibenzothiophenyl group, a 4-dibenzothiophenyl group, a quinolyl group, a 3-quinolyl group, a 4-quinolyl group, a 5-quinolyl group, a 6-quinolyl group, a 7-quinolyl group, a 8-quinolyl group, a 1-isoquinolyl group, a 3-isoquinolyl group, a 4-isoquinolyl group, a 5-isoquinolyl group, a 6-isoquinolyl group, a 7-isoquinolyl group, a 8-isoquinolyl group, a 2-quinoxalinyl group, a 5-quinoxalinyl group, a 6-quinoxalinyl group, a 1-carbazolyl group, a 2-carbazolyl group, a 3-carbazolyl group, a 4-carbazolyl group, a 9-carbazolyl group, a 1-phenanthrydinyl group, a 2-phenanthrydinyl group, a 3-phenanthrydinyl group, a 4-phenanthrydinyl group, a 6-phenanthrydinyl group, a 7-phenanthrydinyl group, a 8-phenanthrydinyl group, a 9-phenanthrydinyl group, a 10-phenanthrydinyl group, a 1-acridinyl group, a 2-acridinyl group, a 3-acridinyl group, a 4-acridinyl group, a 9-acridinyl group, a 1,7-phenanthrolin-2-yl group, a 1,7-phenanthrolin-3-yl group, a 1,7-phenanthrolin-4-yl group, a 1,7-phenanthrolin-5-yl group, a 1,7-phenanthrolin-6-yl group, a 1,7-phenanthrolin-8-yl group, a 1,7-phenanthrolin-9-yl group, a 1,7-phenanthrolin-10-yl group, a 1,8-phenanthrolin-2-yl group, a 1,8-phenanthrolin-3-yl group, a 1,8-phenanthrolin-4-yl group, a 1,8-phenanthrolin-5-yl group, a 1,8-phenanthrolin-6-yl group, a 1,8-phenanthrolin-7-yl group, a 1,8-phenanthrolin-9-yl group, a 1,8-phenanthrolin-10-yl group, a 1,9-phenanthrolin-2-yl group, a 1,9-phenanthrolin-3-yl group, a 1,9-phenanthrolin-4-yl group, a 1,9-phenanthrolin-5-yl group, a 1,9-phenanthrolin-6-yl group, a 1,9-phenanthrolin-7-yl group, a 1,9-phenanthrolin-8-yl group, a 1,9-phenanthrolin-10-yl group, a 1,10-phenanthrolin-2-yl group, a 1,10-phenanthrolin-3-yl group, a 1,10-phenanthrolin-4-yl group, a 1,10-phenanthrolin-5-yl group, a 2,9-phenanthrolin-1-yl group, a 2,9-phenanthrolin-3-yl group, a 2,9-phenanthrolin-4-yl group, a 2,9-phenanthrolin-5-yl group, a 2,9-phenanthrolin-6-yl group, a 2,9-phenanthrolin-7-yl group, a 2,9-phenanthrolin-8-yl group, a 2,9-phenanthrolin-10-yl group, a 2,8-phenanthrolin-1-yl group, a 2,8-phenanthrolin-3-yl group, a 2,8-phenanthrolin-4-yl group, a 2,8-phenanthrolin-5-yl group, a 2,8-phenanthrolin-6-yl group, a 2,8-phenanthrolin-7-yl group, a 2,8-phenanthrolin-9-yl group, a 2,8-phenanthrolin-10-yl group, a 2,7-phenanthrolin-1-yl group, a 2,7-phenanthrolin-3-yl group, a 2,7-phenanthrolin-4-yl group, a 2,7-phenanthrolin-5-yl group, a 2,7-phenanthrolin-6-yl group, a 2,7-phenanthrolin-8-yl group, a 2,7-phenanthrolin-9-yl group, a 2,7-phenanthrolin-10-yl group, a 1-phenadinyl group, a 2-phenadinyl group, a 1-phenothiadinyl group, a 2-phenothiadinyl group, a 3-phenothiadinyl group, a 4-phenothiadinyl group, a 10-phenothiadinyl group, a 1-phenoxadinyl group, a 2-phenoxadinyl group, a 3-phenoxadinyl group, a 4-phenoxadinyl group, a 10-phenoxadinyl group, a 2-oxazolyl group, a 4-oxazolyl group, a 5-oxazolyl group, a 2-oxadiazolyl group, a 5-oxadiazolyl group, a 3-furazanyl group, a 2-thienyl group, a 3-thienyl group, a 2-methylpyrrol-1-yl group, a 2-methylpyrrol-3-yl group, a 2-methylpyrrol-4-yl group, a 2-methylpyrrol-5-yl group, a 3-methylpyrrol-1-yl group, a 3-methylpyrrol-2-yl group, a 3-methylpyrrol-4-yl group, a 3-methylpyrrol-5-yl group, a 2-t-butylpyrrol-4-yl group, a 3-(2-phenylpropyl)pyrrol-1-yl group, a 2-methyl-1-indolyl group, a 4-methyl-1-indolyl group, a 2-methyl-3-indolyl group, a 4-methyl-3-indolyl group, a 2-t-butyl-1-indolyl group, a 4-t-butyl-1-indolyl group, a 2-t-butyl-3-indolyl group, and a 4-t-butyl-3-indolyl group. Among these, a 1-dibenzofuranyl group, a 2-dibenzofuranyl group, a 3-dibenzofuranyl group, a 4-dibenzofuranyl group, a 1-dibenzothiophenyl group, a 2-dibenzothiophenyl group, a 3-dibenzothiophenyl group, a 4-dibenzothiophenyl group, a 1-carbazolyl group, a 2-carbazolyl group, a 3-carbazolyl group, a 4-carbazolyl group, and a 9-carbazolyl group are preferable.

Examples of the substituted or unsubstituted alkyl groups having from 1 to 50 carbon atoms of $R^1$ to $R^8$, $R^{11}$, and $Ar^5$ to $Ar^7$ include a methyl group, an ethyl group, a propyl group, an isopropyl group, a n-butyl group, an s-butyl group, an isobutyl group, a t-butyl group, a n-pentyl group, a n-hexyl group, a n-heptyl group, a n-octyl group, a hydroxymethyl group, a 1-hydroxyethyl group, a 2-hydroxyethyl group, a 2-hydroxyisobutyl group, a 1,2-dihydroxyethyl group, a 1,3-dihydroxyisopropyl group, a 2,3- dihydroxy-t-butyl group, a 1,2,3-trihydroxypropyl group, a chloromethyl group, a 1-chloroethyl group, a 2-chloroethyl group, a 2-chloroisobutyl group, a 1,2-dichloroethyl group, a 1,3-dichloroisopropyl group, a 2,3-dichloro-t-butyl group, a 1,2,3-trichloropropyl group, a bromomethyl group, a 1-bromoethyl group, a 2-bromoethyl group, a 2-bromoisobutyl group, a 1,2-dibromoethyl group, a 1,3-dibromoisopropyl group, a 2,3-dibromo-t-butyl group, a 1,2,3-tribromopropyl group, an iodomethyl group, a 1-iodoethyl group, a 2-iodoethyl group, a 2-iodoisobutyl group, a 1,2-diiodoethyl group, a 1,3-diiodoisopropyl group, a 2,3-diiodo-t-butyl group, a 1,2,3-triiodopropyl group, an aminomethyl group, a 1-aminoethyl group, a 2-aminoethyl group, a 2-aminoisobutyl group, a 1,2-diaminoethyl group, a 1,3-diaminoisopropyl group, a 2,3-diamino-t-butyl group, a 1,2,3-triaminopropyl group, a cyanomethyl group, a 1-cyanoethyl group, a 2-cyanoethyl group, a 2-cyanoisobutyl group, a 1,2-dicyanoethyl group, a 1,3-dicyanoisopropyl group, a 2,3-dicyano-t-butyl group, a 1,2,3-tricyanopropyl group, a nitromethyl group, a 1-nitroethyl group, a 2-nitroethyl group, a 2-nitroisobutyl group, a 1,2-dinitroethyl group, a 1,3-diiodoisopropyl group, a 2,3-dinitro-t-butyl group, and a 1,2,3-trinitropropyl group. Among these, a methyl group, an ethyl group, a propyl group, an isopropyl group, a n-butyl group, a s-butyl group, an isobutyl group, and a t-butyl group are preferable.

Examples of the substituted or unsubstituted cycloalkyl groups having from 3 to 50 ring-forming carbon atoms of $R^1$ to $R^8$, $R^{11}$, and $Ar^5$ to $Ar^7$ include a cyclopropyl group, a cyclobutyl group, a cyclopentyl group, a cyclohexyl group, a 4-methylcyclohexyl group, a 1-adamantyl group, a 2-adamantyl group, a 1-norbornyl group, and a 2-norbornyl group. Among these, a cyclopentyl group and a cyclohexyl group are preferable.

Examples of the substituted or unsubstituted alkoxy groups having from 1 to 50 carbon atoms of $R^1$ to $R^8$ and $R^{11}$ include a group represented by —OZ. Z is selected from the substituted or unsubstituted alkyl group having from 1 to 50 carbon atoms of $R^1$ to $R^8$ described above.

Examples of the substituted or unsubstituted aralkyl groups having from 7 to 50 carbon atoms (wherein an aryl moiety has from 6 to 49 carbon atoms and an alkyl moiety has from 1 to 44 carbon atoms) of $R^1$ to $R^8$, $R^{11}$, and $Ar^5$ to $Ar^7$ include a benzyl group, a 1-phenylethyl group, a 2-phenylethyl group, a 1-phenylisopropyl group, a 2-phenylisopropyl group, a phenyl-t-butyl group, an α-naphthylmethyl group, a 1-α-naphthylethyl group, a 2-α-naphthylethyl group, a 1-α-naphthylisopropyl group, a 2-α-naphthylisopropyl group, β-naphthylmethyl group, a 1-β-naphthylethyl group, a 2-β-naphthylethyl group, a 1-β-naphthylisopropyl group, a 2-β-naphthylisopropyl group, a 1-pyrrolylmethyl group, a 2-(1-pyrrolyl)ethyl group, a p-methylbenzyl group, a m-methylbenzyl group, an o-methylbenzyl group, a p-chlorobenzyl group, a m-chlorobenzyl group, an o-chlorobenzyl group, a p-boromobenzyl group, a m-boromobenzyl group, an o-boromobenzyl group, a p-iodobenzyl group, a m-iodobenzyl group, an o-iodobenzyl group, a p-hydroxybenzyl group, a m-hydroxybenzyl group, an o-hydroxybenzyl group, a p-aminobenzyl group, a m-aminobenzyl group, an o-aminobenzyl group, a p-nitrobenzyl group, a m-nitrobenzyl group, an o-nitrobenzyl group, a p-cyanobenzyl group, a m-cyanobenzyl group, an o-cyanobenzyl group, a 1-hydroxy-2-phenylisopropyl group, and a 1-chloro-2-phenylisopropyl group.

The substituted or unsubstituted aryloxy groups having from 6 to 50 ring-forming carbon atoms of $R^1$ to $R^8$, and $R^{11}$ are a group represented by —OY, and the arylthio group is a group represented by —SY. Y is selected from the substituted or unsubstituted aryl groups having from 6 to 50 ring-forming carbon atoms of $R^1$ to $R^8$.

The substituted or unsubstituted alkoxycarbonyl groups having from 2 to 50 carbon atoms (the alkyl moiety has 1 to 49 carbon atoms) of $R^1$ to $R^8$ and $R^{11}$ are a group represented by —COOZ. Z is selected from the substituted or unsubstituted alkyl groups having from 1 to 50 carbon atoms of $R^1$ to $R^8$.

Examples of the substituted silyl groups of $R^1$ to $R^8$ and $R^{11}$ include a trimethylsilyl group, a triethylsilyl group, a t-butyldimethylsilyl group, a vinyldimethylsilyl group, a propyldimethylsilyl group, and a triphenylsilyl group.

Examples of the halogen atoms of $R^1$ to $R^8$ and $R^{11}$ include fluorine, chlorine, bromine, and iodine.

Examples of the aminoanthracene derivative used as a dopant include a compound represented by Formula (11) below.

[Chemical Formula 11]

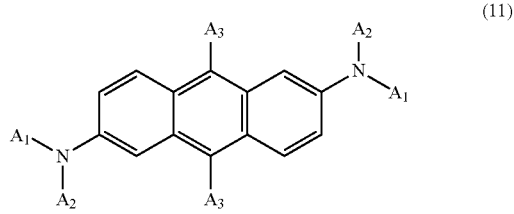

Such a compound is used as a dopant.

In Formula (11), $A_1$ and $A_2$ are each independently a substituted or unsubstituted aliphatic hydrocarbon group having from 1 to 6 ring-forming carbon atoms, a substituted or unsubstituted aromatic hydrocarbon group having from 6 to 20 carbon atoms, or a substituted or unsubstituted heteroaromatic hydrocarbon group having from 5 to 19 carbon atoms, containing any of a nitrogen atom, a sulfur atom, and an oxygen atom. Each $A_3$ is independently a substituted or unsubstituted aliphatic hydrocarbon group having from 1 to 6 carbon atoms, a substituted or unsubstituted aromatic hydrocarbon group having from 6 to 20 carbon atoms, a substituted or unsubstituted heteroaromatic hydrocarbon group having from 5 to 19 carbon atoms, containing any of a nitrogen atom, a sulfur atom, and an oxygen atom, or a hydrogen atom.

Examples of the aminochrysene derivative include a compound represented by Formula (12) below.

[Chemical Formula 12]

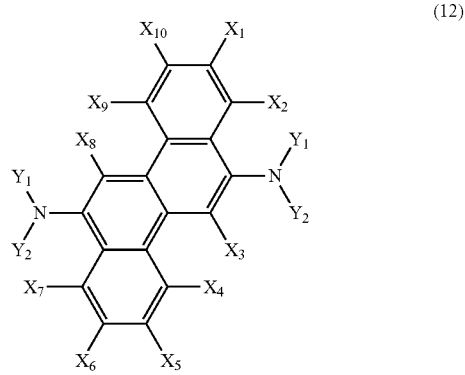

Such a compound is preferable.

In Formula (12), $X_1$ to $X_{10}$ are each independently a hydrogen atom or a substituent, and $Y_1$ and $Y_2$ are each independently a substituent. $X_1$ to $X_{10}$ are preferably a hydrogen atom. $Y_1$ and $Y_2$ are each independently preferably a substituted (preferably substituted with an alkyl group having from 1 to 6 carbon atoms) or unsubstituted aromatic ring (preferably an aromatic ring having from 6 to 10 carbon atoms, or a phenyl group) having from 6 to 30 carbon atoms.

Examples of the aminopyrene derivative include a compound represented by Formula (13) below.

[Chemical Formula 13]

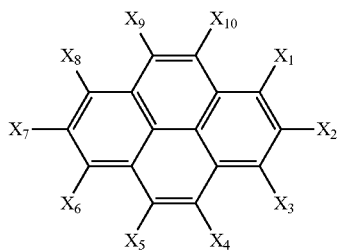

(13)

Such a compound is preferable.

In Formula (13), $X_1$ to $X_{10}$ are each independently a hydrogen atom or a substituent. Provided that $X_3$ and $X_8$ or $X_2$ and $X_7$ are each a —$NY_1Y_2$ group, wherein $Y_1$ and $Y_2$ are a substituent. When $X_3$ and $X_8$ are each —$NY_1Y_2$ group, it is preferable that $X_2$, $X_4$, $X_5$, $X_7$, $X_9$, and $X_{10}$ be a hydrogen atom and $X_1$ and $X_6$ be a hydrogen atom, an alkyl group, or a cycloalkyl group. When $X_2$ and $X_7$ are each —$NY_1Y_2$ group, it is preferable that $X_1$, $X_3$ to $X_6$, and $X_8$ to $X_{10}$ be a hydrogen atom. $Y_1$ and $Y_2$ are preferably a substituted aromatic ring (e.g., substituted with an alkyl group having from 1 to 6 carbon atoms) or unsubstituted aromatic ring (e.g., a phenyl group and a naphthyl group).

The content (doping amount) of the TTF material in the first light-emitting layer 33a is preferably not less than 10 wt %, more preferably not less than 30 wt %, and most preferably not less than 50 wt %.

When the host material is used, it is desirable that the $T_1$ level of the host material be higher than the $T_1$ level of the TTF material. In this case, excitation energy is easily transferred from the host material to the TTF material.

In the present embodiment, it is preferable that the first light-emitting layer 33a have high hole transport property and the second light-emitting layer 33b and the third light-emitting layer 33c have high electron transport property. Therefore, it is desirable that the first light-emitting layer 33a contain a material having a hole mobility higher than the electron mobility and the second light-emitting layer 33b and the third light-emitting layer 33c contain a material having an electron mobility higher than the hole mobility.

When such materials are used, holes are efficiently injected or transported from the positive electrode 2 to the first light-emitting layer 33a, and electrons are efficiently injected or transported from the negative electrode 4 to the second light-emitting layer 33b through the third light-emitting layer 33c. As a result, recombination of carriers (electrons and holes) is likely to occur in the vicinity of interface between the first light-emitting layer 33a and the second light-emitting layer 33b. Therefore, a Dexter transition from the second light-emitting layer 33b to the first light-emitting layer 33a is likely to occur.

Accordingly, when the first light-emitting layer 33a contains the host material, it is desirable that as the host material, the material having a hole mobility higher than the electron mobility be used.

The thickness of the first light-emitting layer 33a is preferably greater than 5 nm, and more preferably less than 5 nm.

In the present embodiment, light emission of the first light-emitting layer 33a is performed by using Dexter energy transfer of excitons generated in the second light-emitting layer 33b. A Dexter transition occurs only between adjacent molecules. Therefore, when the thickness of the first light-emitting layer 33a is large, the light-emitting efficiency may be decreased. Accordingly, it is desirable that the thickness of the first light-emitting layer 33a be not greater than 5 nm.

Second Light-Emitting Layer 33b For the second light-emitting layer 33b, a TADF material is used as the delayed fluorescent material. The second light-emitting layer 33b contains a host material (second host material) and the TADF material, or at least the TADF material.

The TADF material is a material in which a singlet excited state ($S_1$) can be generated by reverse intersystem crossing from a triplet excited state ($T_1$) by thermal activation. The TADF material is a delayed fluorescent material in which the energy difference $\Delta_{EST}$ between the $S_1$ level and the $T_1$ level is extremely small. When the delayed fluorescent material in which the energy difference $\Delta_{EST}$ between the $S_1$ level and the $T_1$ level is extremely small is used for the dopant material, reverse intersystem crossing from the $T_1$ level to the $S_1$ level due to thermal energy occurs. It is considered that use of delayed fluorescence due to the TADF material can theoretically enhance the internal quantum efficiency to 100% in fluorescent emission.

As the TADF material, a known material can be used, and is not particularly limited. Examples of green light-emitting TADF material used in the present embodiment include phenoxazine-triphenyltriazine (PXZ-TRZ). The TADF material may be used alone, or two or more kinds thereof may be appropriately used in combination.

For the TADF material, a material having a higher $T_1$ level than the $T_1$ level of at least one of the host material and the TTF material contained in the first light-emitting layer 33a is selected. In this case, energy is easily transferred from the TADF material to the at least one of the host material and the TTF material contained in the first light-emitting layer 33a.

As the host material, a publicly known host material that has been typically used for an EL layer (in the present embodiment, the organic EL layer) can be used. Examples of the host material include acene-based materials such as a carbazole derivative, anthracene, and tetracene, and derivatives thereof. One kind of the host material may be used alone, or two or more kinds of thereof may be appropriately used in combination.

When the host material is used, it is desirable that the $T_1$ level of the host material be higher than the $S_1$ level and the $T_1$ level of the TADF material. In this case, excitation energy is easily transferred from the host material to the TADF material.

In the present embodiment, it is preferable that the first light-emitting layer 33a have high hole-transporting property and the second light-emitting layer 33b and the third light-emitting layer 33c have high electron-transporting property, as described above.

Therefore, as the host material, an electron-transporting host material having an electron mobility higher than the hole mobility is preferably used. Accordingly, as the host material, for example, an electron-transporting material such as 2,9-dimethyl-4,7-diphenyl-1,10-phenanthroline (BCP, trivial name: bathocuproine) is preferably used.

The content (doping amount) of the TADF material in the second light-emitting layer 33b is preferably not less than 10 wt %, more preferably not less than 30 wt %, and most preferably not less than 50 wt %. Therefore, when the second light-emitting layer 33b contains the host material, the host material is doped with the TADF material such that the second light-emitting layer 33b contains the TADF material in a content of at least 10%.

It is desirable that the HOMO level of a material contained at least at the highest mixing ratio in the second light-emitting layer 33b be higher than the HOMO level of a material contained at least at the highest mixing ratio in the first light-emitting layer 33a. In this case, holes are more easily injected into the second light-emitting layer 33b than the first light-emitting layer 33a.

It is desirable that the HOMO level of the material contained at least at the highest mixing ratio in the second light-emitting layer 33b be higher than the HOMO level of a material contained at least at the highest mixing ratio in the third light-emitting layer 33c. In this case, holes are hardly leaked from the second light-emitting layer 33b to the third light-emitting layer 33c.

It is desirable that the LUMO level of the material contained at least at the highest mixing ratio in the second light-emitting layer 33b be lower than the LUMO level of the material contained at least at the highest mixing ratio in the first light-emitting layer 33a. In this case, electrons are hardly leaked from the second light-emitting layer 33b to the first light-emitting layer 33a.

It is desirable that the LUMO level of the material contained at least at the highest mixing ratio in the second light-emitting layer 33b be lower than the LUMO level of the material contained at least at the highest mixing ratio in the third light-emitting layer 33c. In this case, electrons are more easily injected into the second light-emitting layer 33b than the third light-emitting layer 33c.

Therefore, when materials satisfying the relationships described above are used for the first light-emitting layer 33a, the second light-emitting layer 33b, and the third light-emitting layer 33c, the excitation generation probability in the second light-emitting layer 33b can be enhanced. As a result, the light-emitting efficiency of the second light-emitting layer 33b can be improved. In addition, due to transfer of energy of excitations generated in the second light-emitting layer 33b, light can be efficiently emitted also by the first light-emitting layer 33a and the third light-emitting layer 33c.

The threshold value of photoelectrons that are released by irradiation with ultraviolet light by using an atmospheric pressure photoemission spectrometer "AC-3" available from Riken Keiki Co., Ltd., or the like, is measured. Thus, the HOMO level can be determined. On the other hand, a band gap is determined from the energy of an absorption edge of an absorption spectrum under irradiation with ultraviolet light by using an ultraviolet-visible spectroscopy "UV-2450" available from Shimadzu Corporation. The LUMO level can be determined by calculation from the band gap and the HOMO level determined by the procedure described above.

For comparison of the HOMO level and the LUMO level, an energy difference is important, but not values themselves. Both the HOMO level and the LUMO level can be determined by an ordinary procedure. Therefore, comparison of the HOMO levels and comparison of the LUMO levels that are determined by the same procedure is desirable although details of a measurement method are omitted.

The thickness of the second light-emitting layer 33b is preferably not greater than 20 nm, more preferably from 2 to 20 nm, and even more preferably from 5 to 10 nm.

In the present embodiment, the third light-emitting layer 33c is made to emit light by using a Förster transition (Förster energy transfer) from the TADF material in the second light-emitting layer 33b to a fluorescent material in the third light-emitting layer 33c.

The Förster transition occurs when the materials are within a constant distance without direct contact. The second light-emitting layer 33b is a green light-emitting layer (green-fluorescence emitting layer), and the third light-emitting layer 33c is a red light-emitting layer (red-fluorescence emitting layer). Therefore, the energy levels of the second light-emitting layer 33b and the third light-emitting layer 33c have a relationship of $S_{1G} > S_{1R}$ and $T_{1G} > T_{1R}$. Accordingly, energy is easily transferred from the second light-emitting layer 33b to the third light-emitting layer 33c. When a distance between a molecule of the TADF material and a molecule of the fluorescent material in the third light-emitting layer 33c is not greater than 20 nm, the Förster transition easily and certainly occurs, and the energy transfer efficiency is not deteriorated.

When the thickness of the second light-emitting layer 33b is not greater than 20 nm, the distance between the third light-emitting layer 33c and the molecule of the TADF material that is positioned the farthest from the fluorescent material in the third light-emitting layer 33c (i.e., a surface of the second light-emitting layer 33b on a side opposite to the third light-emitting layer 33c, that is, a surface on the side of the first light-emitting layer 33a) in the second light-emitting layer 33b is not greater than 20 nm. Therefore, the shortest distances between an optional position of the second light-emitting layer 33b and the third light-emitting layer 33c are all not greater than 20 nm. Accordingly, even in the molecule of the TADF material positioned on the surface of the second light-emitting layer 33b on the side opposite to the third light-emitting layer 33c, the Förster transition may occur. The Förster transition from the molecule of the TADF material at the optional position to the fluorescent material in the third light-emitting layer 33c may occur.

To make the thicknesses of the layers uniform and suppress a decrease in light-emitting efficiency, the thickness of the second light-emitting layer 33b is preferably not less than 2 nm, and more preferably not less than 5 nm.

Third Light-Emitting Layer 33c

As described above, the fluorescent material having the longest emission peak wavelength of the light-emitting materials used in the light-emitting layer 33 is used for the third light-emitting layer 33c. The third light-emitting layer 33c contains the host material (third host material) and the fluorescent material, or at least the fluorescent material.

As the fluorescent material, a known fluorescent material can be used, and is not particularly limited as long as it is a fluorescent material having a $S_1$ level lower than the $S_1$ level and the $T_1$ level of the TADF material in the second light-emitting layer 33b. Examples of a red light-emitting fluorescent material used in the present embodiment include a 4-dicyanomethylene-2-methyl-6-(p-dimethylaminostyryl)-4H-pyran (DCM), a 4-dicyanomethylene-2-methyl-6-(julolidin-4-yl-vinyl)-4H-pyran (DCM2), a perylene derivative such as a diindenoperylene derivative, an europium complex, a benzopyran derivative, a rhodamine derivative, a benzothioxanthene derivative, a porphyrin derivative, and nile red.

As the host material, a publicly known host material that has been typically used for an EL layer (in the present embodiment, the organic EL layer) can be used. As the host material, for example, the same host material as the host material used in the second light-emitting layer 33b can be used. Specific examples of the host material include acene-based materials such as a carbazole derivative, anthracene, and tetracene, and derivatives thereof. One kind of the host material may be used alone, or two or more kinds of thereof may be appropriately used in combination.

In the present embodiment, it is preferable that the second light-emitting layer 33b and the third light-emitting layer 33c have high electron-transporting property, as described above. Therefore, it is preferable that an electron-transporting host material having an electron mobility higher than the hole mobility be used for the third light-emitting layer 33c. Accordingly, as the host material, for example, an electron-transporting material such as bathocuproine (BCP) is preferably used.

The content (doping amount) of the fluorescent material in the third light-emitting layer 33c is preferably not less than 10 wt %, more preferably not less than 30 wt %, and most preferably not less than 50 wt %.

The thickness of the third light-emitting layer 33c is preferably not greater than 20 nm, and more preferably from 10 to 20 nm.

The Förster radius is approximately 15 nm. Therefore, for all molecules of the third light-emitting layer 33c having a thickness of not greater than 20 nm, a Förster transition occurs. In the third light-emitting layer 33c having a thickness of not less than 10 nm, energy transfer from the third light-emitting layer 33c to a layer on a side opposite to the second light-emitting layer 33b hardly occurs. Therefore, when the thickness of the third light-emitting layer 33c is from 10 to 20 nm, the light-emitting efficiency is the highest.

Hole Injecting Layer 31 and Hole Transport Layer 32

The hole injecting layer 31 includes a hole-injecting material and has a function to increase the hole injection efficiency to the light-emitting layer 33.

The hole transport layer 32 includes a hole-transporting material and has a function to increase the hole transport efficiency to the light-emitting layer 33.

The hole injecting layer 31 and the hole transport layer 32 may be formed as mutually independent layers, or may be integrated together as a hole injection-cum-transport layer. It is not necessary that both the hole injecting layer 31 and the hole transport layer 32 be provided. Only one of the hole injecting layer 31 and the hole transport layer 32, for example, only the hole transport layer 32 may be provided. Both the hole injecting layer 31 and the hole transport layer 32 may not be provided.

As a material for the hole injecting layer 31, the hole transport layer 32, or the hole injection-cum-transport layer, that is, a material used as the hole-injecting material or the hole-transporting material, a known material can be used.

Examples of the material include linear or heterocyclic conjugated monomers, oligomers, or polymers such as naphthalene, anthracene, azatriphenylene, fluorenone, hydrazone, stilbene, triphenylene, benzine, styrylamine, triphenylamine, porphyrins, triazole, imidazole, oxadiazole, oxazole, polyarylalkane, phenylenediamine, arylamine, and derivative thereof, a thiophene-based compound, a polysilane-based compound, a vinyl carbazole-based compound, and an aniline-based compound.

Specifically, N,N'-di(naphthalen-1-yl)-N,N'-diphenyl-benzidine (α-NPD), 2,3,6,7,10,11-hexacyano-1,4,5,8,9,12-hexaazatriphenylene (HAT-CN), 1,3-bis(carbazol-9-yl)benzene (mCP), di-[4-(N,N-ditolyl-amino)-phenyl]cyclohexane (TAPC), 9,10-diphenylanthracene-2-sulfonate (DPAS), N,N'-diphenyl-N,N'-(4-(di(3-tolyl)amino)phenyl)-1,1'-biphenyl-4,4'-diamine (DNTPD), iridium (III) tris[N,N'-diphenylbenzimidazol-2-ylidene-C2,C2'] (Ir(dpbic)$_3$), 4,4',4"-tris-(N-carbazolyl)-triphenylamine (TCTA), 2,2-bis(p-trimellitic oxyphenyl)propanoic anhydride (BTPD), bis[4-(p,p-ditolylamino)phenyl]diphenylsilane (DTASi), or the like is used.

For the hole injecting layer 31, the hole transport layer 32, or the hole injection-cum-transport layer, an intrinsic hole-injecting material or an intrinsic hole-transporting material that is not doped with an impurity may be used. Alternatively, the material may be doped with an impurity to enhance the electrical conductivity.

To obtain highly-efficient light emission, it is desirable that the excitation energy be trapped within the light-emitting layer 33. Therefore, it is desirable that as the hole-injecting material and the hole-transporting material, a material having an $S_1$ level and a $T_1$ level that are excitation levels higher than the $S_1$ level and the $T_1$ level of the fluorescent material (dopant material) in the light-emitting layer 33 be used. Therefore, it is more preferable that as the hole-injecting material and the hole-transporting material, a material having high excitation level and high hole mobility be selected.

Electron Transport Layer 34 and Electron Injecting Layer 35

The electron injecting layer 35 includes an electron-injecting material and has a function to increase the electrode injection efficiency to the light-emitting layer 33.

The electron transport layer 34 includes an electron-transporting material and has a function to increase the electron transport efficiency to the light-emitting layer 33.

The electron injecting layer 35 and the electron transport layer 34 may be formed as mutually independent layers, or may be integrated together as an electron injection-cum-transport layer. It is not necessary that both the electron injecting layer 35 and the electron transport layer 34 be provided. Only one of the electron injecting layer 35 and the electron transport layer 34, for example, only the electron transport layer 34 may be provided. Both the electron injecting layer 35 and the electron transport layer 34 may not be provided.

As a material for the electron injecting layer 35, the electron transport layer 34, or the electron injection-cum-transport layer, that is, a material used as the electron-injecting material or the electron-transporting material, a known material can be used.

Examples of the material include quinoline, perylene, phenanthroline, bisstyryl, pyrazine, triazole, oxazole, oxadiazole, fluorenone, and derivatives and metal complexes thereof, and lithium fluoride (LiF).

Specific examples thereof include 4,7-diphenyl-1,10-phenanthroline (Bphen), 3,3'-bis(9H-carbazol-9-yl)biphenyl (mCBP), 2,9-dimethyl-4,7-diphenyl-1,10-phenanthroline (BCP), 1,3,5-tris(N-phenylbenzimidazol-2-yl)benzene (TPBI), 3-phenyl-4(1'-naphthyl)-5-phenyl-1,2,4-triazole (TAZ), 1,10-phenanthroline, Alq(tris(8-hydroxyquinoline) aluminum), and LiF.

For the electron injecting layer 35, the electron transport layer 34, or the electron injection-cum-transport layer, an intrinsic electron-injecting material or an intrinsic electron-transporting material that is not doped with an impurity may be used. Alternatively, the material may be doped with an impurity to enhance the electrical conductivity.

To obtain highly-efficient light emission, it is desirable that the excitation energy be trapped within the light-emitting layer 33. Therefore, it is desirable that as the electron-injecting material and the electron-transporting material, a material having an $S_1$ level and a $T_1$ level that are excitation levels higher than the $S_1$ level and the $T_1$ level of the dopant material in the adjacent light-emitting layer 33 be used. Therefore, it is more preferable that as the electron-injecting material and the electron-transporting material, a material having high excitation level and high electron mobility be selected.

The thicknesses of the layers formed as necessary, other than the light-emitting layer 33 is appropriately set such that excitons are generated in the second light-emitting layer 33b, but is not particularly limited. The thicknesses may be set according to the mobility of carriers (holes and electrons) in each layer, the balance thereof, or the kind of material constituting each layer. The thicknesses of the layers can be set similarly to those in the known organic EL element.

Principle of Light Emission

Next, the principle of light emission of the organic EL element 10 according to the present embodiment will be described hereinafter with reference to FIGS. 1A and 1B.

In the organic EL element 10 according to the present embodiment, light can be emitted by using the following features. (1) When light-emitting layers having different emission peak wavelengths are layered, the excitation energy is easily transferred from the light-emitting layer of which the emission peak wavelength is on the shorter wavelength side to the light-emitting layer of which the emission peak wavelength is on the longer wavelength side. (2) Since in the TADF material, excitons can be freely transferred between the $S_1$ level and the $T_1$ level, excitons are generated uniformly in the $S_1$ level and the $T_1$ level of the TADF material. (3) The TTF material can be made to emit light by re-excitation from the $T_1$ level to the $S_1$ level.

The organic EL element 10 has a configuration in which the first light-emitting layer 33a (blue light-emitting layer) having the shortest emission peak wavelength of the light-emitting layer 33, the second light-emitting layer 33b (green light-emitting layer), and the third light-emitting layer 33c (red light-emitting layer) having the longest emission peak wavelength of the light-emitting layer 33 are layered in this order between a pair of electrodes (the positive electrode 2 and the negative electrode 4). The first light-emitting layer 33a contains the host material and the TTF material or at least the TTF material. The second light-emitting layer 33b contains the host material and the TADF material or at least the TADF material. The third light-emitting layer 33c contains the host material and the fluorescent material or at least the fluorescent material. The $T_1$ level of at least one of the host material and the TTF material contained in the first light-emitting layer 33a is lower than the $T_1$ level of the TADF material contained in the second light-emitting layer 33b.

Even when excitons are generated in a general fluorescent material, as described above, 25% of singlet excitons can be only used in light emission.

However, in the TADF material, an energy difference $\Delta_{EST}$ between the $S_1$ level and the $T_1$ level is extremely small, as illustrated in FIG. 1A. The TADF material is a delayed fluorescent material in which a singlet excited state ($S_1$) can be generated by reverse intersystem crossing from a triplet excited state ($T_1$) by thermal activation. Therefore, light can be emitted by returning triplet excitons into the singlet excitons. It is considered that use of delayed fluorescence of the TADF material can theoretically enhance the internal quantum efficiency to 100% in fluorescent emission, as described above.

As described in (2), in the TADF material, excitons can be freely transferred between the $S_1$ level and the $T_1$ level. Therefore, excitons are generated uniformly in the $S_1$ level and the $T_1$ level of the thermally activated delayed fluorescent material.

As the emission peak wavelength is shorter, the energy level of the light-emitting material is higher. The second light-emitting layer 33b is a green light-emitting layer, and the third light-emitting layer 33c is a red light-emitting layer. Therefore, the energy levels of the second light-emitting layer 33b and the third light-emitting layer 33c have a relationship of $S_{1G}>S_{1R}$ and $T_{1G}>T_{1R}$, as illustrated in FIG. 1A. Accordingly, energy is easily transferred from the second light-emitting layer 33b that is the green light-emitting layer to the third light-emitting layer 33c that is the red light-emitting layer, as described in (1).

According to the present embodiment, Förster energy transfer (Förster transition) from the TADF material in the second light-emitting layer 33b to the fluorescent material in the third light-emitting layer 33c having a $S_1$ level lower than the TADF material occurs, as illustrated in FIGS. 1A and 1B. According to the present embodiment, light emission can be efficiently achieved not only in the second light-emitting layer 33b but also in the third light-emitting layer 33c.

Further, in the organic EL element 10, the $T_1$ level of at least one of the host material and the TTF material contained in the first light-emitting layer 33a (e.g., the $T_1$ level of the TTF material, as illustrated in FIG. 1A) is lower than the $T_1$ level of the TADF material contained in the second light-emitting layer 33b. Therefore, excitation energy is easily transferred from the TADF material in the second light-emitting layer 33b to the host material or the TTF material contained in the first light-emitting layer 33a.

At that time, Dexter energy transfer from the TADF material in the second light-emitting layer 33b to the host material or the TTF material in the first light-emitting layer 33a occurs, as illustrated in FIGS. 1A and 1B. This is because the second light-emitting layer 33b is layered on the first light-emitting layer 33a (that is, the second light-emitting layer 33b is in contact with the first light-emitting layer 33a). Subsequently, due to the TTF phenomenon, re-excitation from the $T_1$ level of the host material or the $T_1$ level of the TTF material to the $S_1$ level of the TTF material occurs in the first light-emitting layer 33a, as illustrated in (3). According to the present embodiment, light emission can be efficiently achieved also in the first light-emitting layer 33a.

Therefore, according to the present embodiment, use of a fluorescent material containing at least two kinds of delayed fluorescent materials for the light-emitting layer 33, as described above, can achieve emission of lights of three colors with efficiency.

As described above, in the organic EL element 10, the fluorescent material containing the delayed fluorescent material is used to emit light, and a phosphorescent material is not used. Therefore, a reduction in cost can be attained. Accordingly, according to the present embodiment, a highly-efficient white light-emitting device using three-color light emission at low cost can be provided.

When Dexter energy transfer from the $T_1$ level of the TADF material in the second light-emitting layer 33b directly to the $T_1$ level of the TTF material in the first light-emitting layer 33a occurs, light emission can be more efficiently archived in the first light-emitting layer 33a. When Förster energy transfer from the $T_1$ level of the TADF material in the second light-emitting layer 33b directly to the $T_1$ level of the fluorescent material in the third light-emitting layer 33c occurs, light emission can be more efficiently archived in the third light-emitting layer 33c.

When the electrode on the side of the first light-emitting layer 33a is the positive electrode 2 and the electrode on the side of the third light-emitting layer 33c is the negative electrode 4, like the present embodiment, holes are efficiently injected or transported from the positive electrode 2 to the first light-emitting layer 33a, and electrons are efficiently injected or transported from the negative electrode 4 to the second light-emitting layer 33b through the third light-emitting layer 33c. This is because the first light-emitting layer 33a has high hole-transporting property and the second light-emitting layer 33b and the third light-emitting layer 33c have high electron-transporting property. Therefore, recombination of carriers is likely to occur in the vicinity of the interface between the first light-emitting layer 33a and the second light-emitting layer 33b, as illustrated in FIG. 1B. Accordingly, the exciton generation probability in the second light-emitting layer 33b is increased, and a Dexter transition from the second light-emitting layer 33b to the first light-emitting layer 33a is likely to occur. As described above, the Dexter transition occurs due to direct contact of materials (molecules). However, a Förster transition from the $S_1$ level of the TADF material to the $S_1$ level of the fluorescent material occurs when the materials are within a constant distance without direct contact. Therefore, this configuration makes it possible to emit lights of three colors with efficiency.

Method for Manufacturing Organic EL Element 10

A method for manufacturing the organic EL element 10 includes the steps of forming a first electrode that is one of the pair of electrodes (the positive electrode 2 and the negative electrode 4), forming the organic EL layer 3 (functional layer forming step), and forming a second electrode that is the other of the pair of electrodes.

In a process of manufacturing the organic EL element 10, the organic EL layer forming step is performed between the step of forming the first electrode and the step of forming the second electrode. Thus, the organic EL layer 3 is formed between the first electrode and the second electrode. Therefore, the step of forming the organic EL layer 3 between the first electrode and the second electrode includes at least steps of forming the first light-emitting layer 33a (first light-emitting layer forming step), forming the second light-emitting layer 33b (second light-emitting layer forming step), and forming the third light-emitting layer 33c (third light-emitting layer forming step).

The first light-emitting layer forming step and the second light-emitting layer forming step are continuously performed such that the second light-emitting layer 33b is layered between the first light-emitting layer 33a and the third light-emitting layer 33c and the first light-emitting layer 33a and the second light-emitting layer 33b are adjacent to each other.

In the present embodiment, the first electrode is the positive electrode 2, the organic EL layer forming step includes forming the hole injecting layer 31 on the positive electrode 2, forming the hole transport layer 32 on the hole injecting layer 31, forming the first light-emitting layer 33a on the hole injecting layer 31, forming the second light-emitting layer 33b on the first light-emitting layer 33a, forming the third light-emitting layer 33c on the second light-emitting layer 33b, forming the electron transport layer 34 on the third light-emitting layer 33c, and forming the electron injecting layer 35 on the electron transport layer 34, and the negative electrode 4 is formed as the second electrode on the electron injecting layer 35.

For example, an electrically conductive film (electrode film) is formed on the substrate 1, a photoresist is applied to the electrically conductive film, patterning is performed by photolithography, the electrically conductive film is etched, and the photoresist is peeled. Thus, the first electrode can be formed.

In layering the electrically conductive film, a sputtering method, a CVD method, a plasma CVD method, a printing method, or the like can be employed.

In the present embodiment, the non-translucent electrode 21 and the light-transmitting electrode 22 are formed as the positive electrode 2, as illustrated in FIG. 2.

The functional layers constituting the organic EL layer 3, such as the hole injecting layer 31, the hole transport layer 32, the first light-emitting layer 33a, the second light-emitting layer 33b, the third light-emitting layer 33c, the electron transport layer 34, and the electron injecting layer 35, can be formed by various types of procedures.

For example, the layers can be formed by a publicly known wet process by a coating method such as a spin coating method, a dipping method, a doctor blade method, a discharge coating method, and a spray coating method, or a printing method such as an inkjet method, a letterpress printing method, an intaglio printing method, a screen printing method, and a microgravure-coating method. In the process, a coating liquid for formation of the organic EL layer in which the materials for the layers are dissolved and dispersed in a solvent is used.

The layers can be also formed by a publicly known dry process by a resistive heating vapor deposition method, an electron beam (EB) vapor deposition method, a molecular beam epitaxy (MBE) method, a sputtering method, an organic vapor phase deposition (OVPD) method, or the like, using the materials. The host material can be doped with the dopant material by co-evaporation deposition of the dopant material and the host material.

Alternatively, the layers can be formed by a laser transfer method using the materials.

When the organic EL layer 3 is formed by a wet process, the coating liquid for formation of the organic EL layer may contain an additive for adjusting the physical properties of the coating liquid, such as a leveling agent and a viscosity adjusting agent.

In formation of the second electrode, a sputtering method, a vacuum vapor deposition method, a CVD method, a plasma CVD method, a printing method, or the like can be employed. Patterning may be performed by photolithography.

Hereinafter, the present embodiment will be described in detail with reference to Examples. In the following Examples, a part of components will be described by using specific dimensions and materials as examples. However, the present embodiment is not limited to the specific dimensions and materials. That is, the present embodiment is not limited to the following Examples.

Example 1

In Example 1, the non-translucent electrode 21, the light-transmitting electrode 22, the hole injecting layer 31, the hole transport layer 32, the first light-emitting layer 33a, the second light-emitting layer 33b, the third light-emitting layer 33c, the electron transport layer 34, the electron injecting layer 35, and the negative electrode 4 were layered in this order on the substrate 1, as illustrated in FIG. 2.

As the substrate 1, a glass substrate was used. Materials for the layers layered on the substrate 1 and thicknesses thereof are as follows.

Non-translucent electrode 21 (positive electrode 2, reflective electrode): Ag (100 nm)
Light-transmitting 22 (positive electrode 2): ITO (65 nm)
Hole injecting layer 31: HAT-CN (10 nm)
Hole transport layer 32: α-NPD (20 nm)
First light-emitting layer 33a (blue light-emitting layer, light-emitting layer 33): BH1 (host material, 90%)/BD1 (TTF material, 10%) (5 nm)
Second light-emitting layer 33b (green light-emitting layer, light-emitting layer 33): BCP (host material, 50%)/PXZ-DPS (TADF material, 50%) (10 nm)
Third light-emitting layer 33c (red light-emitting layer, light-emitting layer 33): BCP (host material, 90%)/DCM (fluorescent material, 10%) (20 nm)
Electron transport layer 34: Bphen (30 nm)
Electron injecting layer 35: LiF (1 nm)
Negative electrode 4 (translucent electrode): Ag—Mg alloy (Ag/Mg mixing ratio=0.9/0.1) (20 nm)

For the first light-emitting layer 33a, as a dopant material (TTF material) and a host material that cause a TTF phenomenon, a combination of delayed fluorescent materials that cause TTF from the $T_1$ level of BH1 that is the host material to the $S_1$ level of BD1 that is the dopant material (TTF material) was used. Specifically, of the combination of the dopant material and the host material that cause a TTF phenomenon, a host material that satisfies the conditions described above for carrier-transporting properties (hole-transporting property and electron-transporting property) and energy levels (HOMO level, LUMO level, $T_1$ level, and $S_1$ level) was selected, and a dopant material suitable for the host material was selected.

The $T_1$ level of BH1 is lower than the $T_1$ level of PXZ-DPS that is the dopant material (TADF material) of the second light-emitting layer 33b. The $S_1$ level of BD1 is higher than the $T_1$ level of BH1.

In Example 1, since the $T_1$ level of BH1 is lower than the $T_1$ level of the TADF material, Dexter energy transfer from the TADF material to at least one of BH1 and BD1 occurs, and due to TTF, upconversion from the $T_1$ level of the BH1 or the $T_1$ level of BD1 to the $S_1$ level of BD1 occurs. In the present embodiment, BD1 having a $S_1$ level higher than the $S_1$ level of the dopant material (TADF material) of the second light-emitting layer 33b is made to emit light by using delayed fluorescence due to the TTF phenomenon, as described above.

At that time, the $T_1$ level of BD1 is higher than the $T_1$ level of BH1. Therefore, triplet excitons of BH1 are not transferred to BD1, triplet excitons generated in BD1 are transferred as energy to BH1, and due to the TTF phenomenon, the triplet excitons collide with each other on BH1, to generate singlet excitons. The singlet excitons generated due to the TTF phenomenon are transferred as energy from BH1 to BD1 that emits light, and contribute to fluorescence emission of BD1.

As described above, in the organic EL element 10 according to this Example, the first light-emitting layer 33a is a blue light-emitting layer, the second light-emitting layer 33b is a green light-emitting layer, and the third light-emitting layer 33c is a red light-emitting layer. Further, the first light-emitting layer 33a contains a delayed fluorescent material having the shortest wavelength of the fluorescent materials used for the light-emitting layer 33, and the third light-emitting layer 33c contains a fluorescent material a fluorescent material having the longest wavelength of the fluorescent materials used for the light-emitting layer 33. Moreover, the second light-emitting layer 33b contains the TADF material, the proportion of the TADF material to be mixed in the second light-emitting layer 33b is high, and the thickness of the second light-emitting layer 33b is small.

In this Example, the host material (BH1) contained in the first light-emitting layer 33a has a hole mobility higher than the electron mobility, and the host material contained in the second light-emitting layer 33b and the host material (BCP) contained in the third light-emitting layer 33c have an electron mobility higher than the hole mobility. Therefore, for transporting properties of the host materials, the hole-transporting property of the first light-emitting layer 33a is high and the electron-transporting property of the second light-emitting layer 33b and the third light-emitting layer 33c is high.

In the present embodiment, the first light-emitting layer 33a is on a side of the positive electrode 2. Therefore, holes injected from the positive electrode 2 are accepted from the hole transport layer 32 through the hole injecting layer 31, and then transferred to the second light-emitting layer 33b by the first light-emitting layer 33a.

The third light-emitting layer 33c is on a side of the negative electrode 4. Therefore, electrons injected from the negative electrode 4 are accepted from the electron transport layer 34 through the electron injecting layer 35, and then transferred to the second light-emitting layer 33b by the third light-emitting layer 33c.

In the second light-emitting layer 33b positioned between the first light-emitting layer 33a and the third light-emitting layer 33c, the holes transferred from the first light-emitting layer 33a and the electrons transferred from the third light-emitting layer 33c are subjected to recombination, resulting in fluorescence emission.

Since the TADF material excited in the second light-emitting layer 33b is brought into direct contact with the host material and the TTF material in the first light-emitting layer 33a, a Dexter transition from the second light-emitting layer 33b to the first light-emitting layer 33a occurs. In the first light-emitting layer 33a, TTF occurs between the triplet excitons of the host material and the triplet excitons of the dopant material, the energy is transferred to the singlet excitons of the dopant, the dopant is re-excited, and fluorescence emission from the singlet excitons of the dopant occurs.

Since the thickness of the second light-emitting layer 33b is small, Förster energy transfer from the first light-emitting layer 33a to the third light-emitting layer 33c (resonance energy transfer, Förster transition) occurs. Therefore, in the dopant of the third light-emitting layer 33c, fluorescence emission also occurs.

The HOMO level of BH1 and the HOMO level of BD1 are lower than the HOMO level of the host material and the HOMO level of the dopant material in the second light-emitting layer 33b. The LUMO level of BH1 and the LUMO level of BD1 are higher than the LUMO level of the host material and the LUMO level of the dopant material in the second light-emitting layer 33b. Therefore, holes are more easily injected into the second light-emitting layer 33b than the first light-emitting layer 33a, and electrons are hardly leaked from the second light-emitting layer 33b to the first light-emitting layer 33a.

The LUMO level of the host material and the LUMO level of the dopant material in the second light-emitting layer 33b are lower than the LUMO level of the host material and the LUMO level of the dopant material in the third light-emitting layer 33c. The HOMO level of the host material and the HOMO level of the dopant material in the second light-emitting layer 33b are higher than the HOMO level of the host material and the HOMO level of the dopant material in the third light-emitting layer 33c. Therefore, electrons are more easily injected into the second light-emitting layer 33b than the third light-emitting layer 33c, and holes are hardly leaked from the second light-emitting layer 33b to the third light-emitting layer 33c.

In this Example, the TTF material that emits blue light, the TADF material that emits green light, and the fluorescent material that emits red light are layered in this order. In this case, energy transfer in the order of the $T_1$ level of the TADF material that emits green light, the $T_1$ level of the TTF material that emits blue light, and the $S_1$ level of the TTF material that emits blue light occurs. Therefore, not only green light emission but also blue light emission can be achieved. Further, energy transfer from the $S_1$ level of the TADF material that emits green light to the $S_1$ level of the fluorescent material that emits red light also occurs. Therefore, red light emission can be also achieved.

Accordingly, according to this Example, a highly-efficient white light-emitting device can be realized at low cost.

In this Example, a case where the organic EL element 10 of white light emission using three-color light emission is formed is described as an example, as described above. However, when the thickness of the positive electrode 2, and more specifically, the thickness of the light-transmitting electrode 22 (ITO) is modified to match the wavelength of light to be enhanced, display of other color can be also achieved.

Example 2

In Example 1, a case where the first light-emitting layer 33a, the second light-emitting layer 33b, and the third light-emitting layer 33c are formed by doping the host material with the fluorescent material as the dopant material is described as an example.

However, as described above, the first light-emitting layer 33a, the second light-emitting layer 33b, and the third light-emitting layer 33c may be each formed from the host material and the dopant material (fluorescent material) or from the dopant material alone.

In Example 2, the second light-emitting layer 33b was formed from a TADF material that is a delayed fluorescent material.

Specifically, the organic EL element 10 having the following configuration was formed. In Example 2, as illustrated in FIG. 2, the non-translucent electrode 21, the light-transmitting electrode 22, the hole injecting layer 31, the hole transport layer 32, the first light-emitting layer 33a, the second light-emitting layer 33b, the third light-emitting layer 33c, the electron transport layer 34, the electron injecting layer 35, and the negative electrode 4 were layered on the substrate 1 in this order from the substrate 1 side, like Example 1.

As the substrate 1, a glass substrate was used. Materials for the layers layered on the substrate 1 and thicknesses thereof are as follows.

Non-translucent electrode 21 (positive electrode 2, reflective electrode): Ag (100 nm)

Light-transmitting electrode 22 (positive electrode 2): ITO (65 nm)

Hole injecting layer 31: HAT-CN (10 nm)

Hole transport layer 32: α-NPD (20 nm)

First light-emitting layer 33a (blue light-emitting layer, light-emitting layer 33): BH1 (host material, 90%)/BD1 (TTF material, 10%) (5 nm)

Second light-emitting layer 33b (green light-emitting layer, light-emitting layer 33): PXZ-DPS (TADF material, 10 nm)

Third light-emitting layer 33c (red light-emitting layer, light-emitting layer 33): BCP (host material, 90%)/DCM (fluorescent material, 10%) (20 nm)

Electron transport layer 34: Bphen (30 nm)

Electron injecting layer 35: LiF (1 nm)

Negative electrode 4: Ag—Mg alloy (Ag/Mg mixing ratio=0.9/0.1) (20 nm)

The organic EL element 10 in Example 2 is the same as the organic EL element 10 in Example 1 except that the second light-emitting layer 33b is a single film of a TADF material that is the dopant material.

Therefore, according to Example 2, the same effects as those in Example 1 can be obtained. In addition, since 100% or substantially 100% of the second light-emitting layer 33b is a single film of the TADF material, a decrease in efficiency of light emission generated by excitation of excitons by the host material and deactivation can be prevented.

Second Embodiment

Another embodiment of the disclosure will be described as follows, with reference to FIG. 3.

The present embodiment will be described about differences between the present embodiment and the first embodiment, and components having the same functions as those of the components described in the first embodiment are appended with the same reference signs, and the description thereof is omitted. Obviously, the same modifications as those of the first embodiment may also be applied to the present embodiment.

Figure 3:
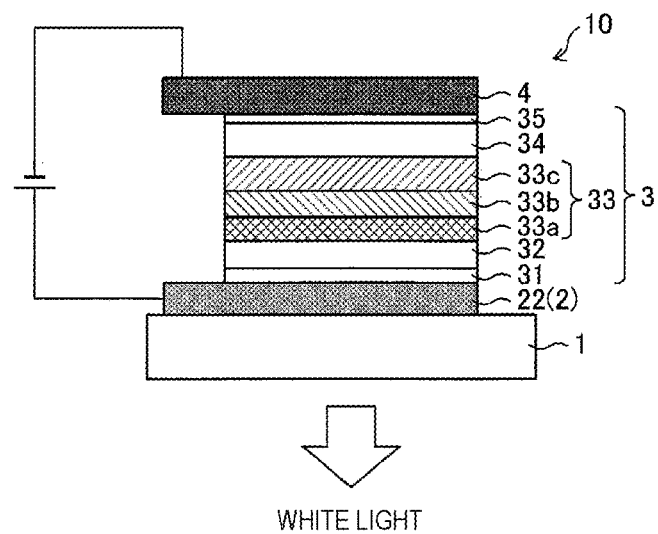
FIG. 3 is a cross-sectional view of an example of a schematic configuration of a light-emitting element according to a second embodiment of the disclosure.

FIG. 3 is a cross-sectional view of an example of a schematic configuration of a light-emitting element according to the present embodiment. In the present embodiment, the organic EL element 10 will be described as an example of the light-emitting element according to the present embodiment.

As illustrated in FIG. 3, the organic EL element 10 according to the present embodiment includes the positive electrode 2 (first electrode), the organic EL layer 3, and the negative electrode 4 (second electrode) that are layered on the substrate 1 in this order, like the organic EL element 10 according to the first embodiment.

The organic EL element 10 according to the present embodiment is a bottom-emitting organic EL element, in which light emitted from the light-emitting layer 33 of the organic EL layer 3 is extracted as white light from the substrate 1 side.

In the organic EL element 10 that is the bottom-emitting organic EL element, an insulating substrate having a light-transmitting property, which is called transparent substrate or light-transmitting substrate, such as a glass substrate and a plastic substrate, is used as the substrate 1.

In the organic EL element 10 that is the bottom-emitting organic EL element, it is preferable that the positive electrode 2 be formed of the light-transmitting electrode 22 formed from a light-transmitting electrode material and the negative electrode 4 be formed from a non-translucent electrode material such as a reflective metal electrode material.

As the light-transmitting electrode material and the non-translucent electrode material, for example, the materials exemplified in the first embodiment can be used.

The organic EL element 10 according to the present embodiment is the same as the organic EL element 10 according to the first embodiment except that the bottom-emitting organic EL element is employed, the positive electrode 2 is the light-transmitting electrode 22, and the negative electrode 4 is formed from the non-translucent electrode material.

Hereinafter, the configuration of the organic EL element 10 according to the present embodiment will be described by using Example. In the following Example, a part of components will be described by using specific dimensions and materials as examples. However, the present embodiment is not also limited to the following Examples.

Example 3

In Example 3, the light-transmitting electrode 22, the hole injecting layer 31, the hole transport layer 32, the first light-emitting layer 33a, the second light-emitting layer 33b, the third light-emitting layer 33c, the electron transport layer 34, the electron injecting layer 35, and the negative electrode 4 were layered in this order on the substrate 1, as illustrated in FIG. 3.

As the substrate 1, a glass substrate was used. Materials for the layers layered on the substrate 1 and thicknesses thereof are as follows.

Light-transmitting electrode 22 (positive electrode 2): ITO (100 nm)

Hole injecting layer 31: HAT-CN (10 nm)

Hole transport layer 32: α-NPD (20 nm)

First light-emitting layer 33a (blue light-emitting layer, light-emitting layer 33): BH1 (host material, 90%)/BD1 (TTF material, 10%) (5 nm)

Second light-emitting layer 33b (green light-emitting layer, light-emitting layer 33): BCP (host material, 50%)/PXZ-DPS (TADF material, 50%) (10 nm)

Third light-emitting layer 33c (red light-emitting layer, light-emitting layer 33): BCP (host material, 90%)/DCM (fluorescent material, 10%) (20 nm)

Electron transport layer 34: Bphen (30 nm)

Electron injecting layer 35: LiF (1 nm)

Negative electrode 4 (reflective electrode): Al (100 nm)

The organic EL element 10 in Example 3 is the same as the organic EL element 10 in Example 1 except that the materials for the positive electrode 2 and the negative electrode 4 and thicknesses thereof are changed.

In Example 1, the light emitted from the light-emitting layer 33 is extracted as white light from the negative electrode 4 side directly or after reflection by the non-translucent electrode 21 that is a reflective electrode. In Example 3, the light emitted from the light-emitting layer 33 is extracted as white light from the substrate 1 side (that is, the positive electrode 2 side) directly or after reflection by the negative electrode 4 that is the reflective electrode. According to Example 3, the same effects as those in Example 1 can be obtained.

As described above, according to the present embodiment, the bottom-emitting organic EL element 10 having the same effects as those in the first embodiment can be provided.

Third Embodiment

Yet another embodiment of the disclosure will be described as follows, with reference to FIGS. 4 and 5.

The present embodiment will be described about differences between the present embodiment and the first embodiment, and components having the same functions as those of the components described in the first embodiment are appended with the same reference signs, and the description thereof is omitted. Obviously, the same modifications as those of the first embodiment may also be applied to the present embodiment.

Figure 4:
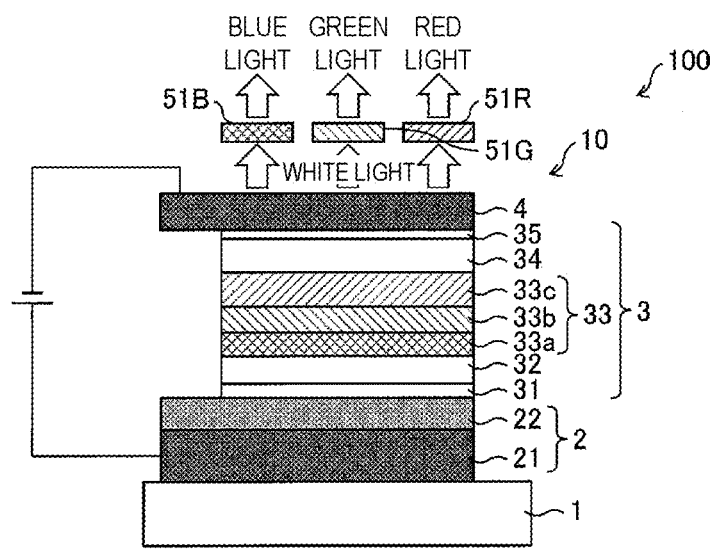
FIG. 4 is a cross-sectional view of an example of a schematic configuration of a light-emitting element according to a third embodiment of the disclosure and a main portion of an electronic device provided with the light-emitting element.
Figure 5:
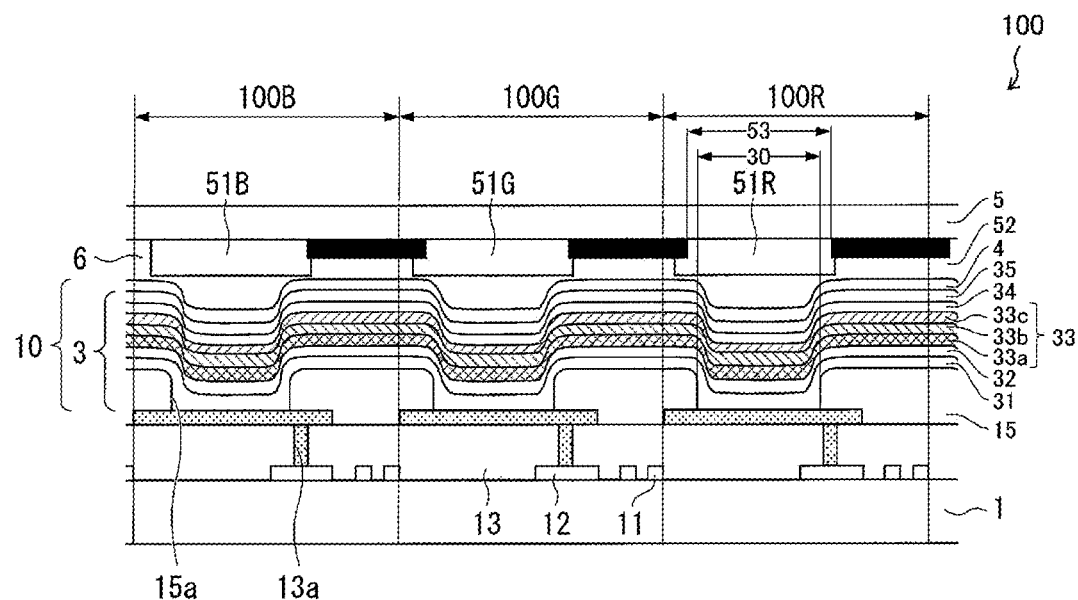
FIG. 5 is another cross-sectional view of the example of the schematic configuration of the light-emitting element according to the third embodiment of the disclosure and the main portion of the electronic device provided with the light-emitting element.

FIGS. 4 and 5 are each a cross-sectional view of an example of a schematic configuration of a light-emitting element according to the present embodiment and a main portion of an electronic device provided with the light-emitting element.

The light-emitting element according to the disclosure can be developed for display applications. Hereinafter, an organic EL display device 100 provided with the organic EL element 10, as illustrated in FIGS. 4 and 5, will be described as an example of an electronic device provide with the light-emitting element according to the disclosure.

As illustrated in FIG. 5, in the organic EL display device 100 provided with the organic EL element 10, a signal line 11 and a TFT 12 are provided on the substrate 1 to correspond to each of pixels 100R, 100G, and 100B.

An interlayer insulating film 13 is layered as a flattened film on the substrate 1 over the whole region of the substrate 1 to cover the signal line 11 and the TFT 12.

For example, the signal line 11 includes a plurality of gate lines of selecting a pixel, a plurality of source lines of writing datum, a plurality of power source lines of supplying electric power to the organic EL element 10, and the like.

The signal line 11 is connected to an external circuit not illustrated. When an electrical signal is input in the signal line 11 from the external circuit, the organic EL element 10 can be driven (can be made to emit light).

When the organic EL display device 100 is an active matrix display device, at least one TFT 12 is disposed in each of the pixels 100R, 100G, and 100B. In each of the pixels 100R, 100G, and 100B, a capacitor configured to retain a writing voltage, a compensation circuit configured to compensate variation of properties of the TFT 12, and the like may be formed.

For the interlayer insulating film 13, a known photosensitive resin can be used. As the photosensitive resin, for example, an acrylic resin or a polyimide resin can be used.

In the interlayer insulating film 13, a contact hole 13a for electrically connecting the positive electrode 2 in the organic EL element 10 to the TFT 12 is provided.

An end portion of the positive electrode 2 is covered with an edge cover 15. The edge cover 15 is an insulating film, and for example, includes a photosensitive resin. The edge cover 15 prevents short circuit with the negative electrode 4 due to concentration of the electrodes or a decrease in thickness of the organic EL layer 3, at the end portion of the positive electrode 2. The edge cover 15 functions as a pixel separation film so as not to leak a current to the adjacent pixels 100R, 100G, and 100B.

An opening 15a is provided in the edge cover 15 at each of the pixels 100R, 100G and 100B. An exposed area of the positive electrode 2 due to the opening 15a is a light-emitting region 30 of each of the pixels 100R, 100G and 100B.

In the organic EL layer 3, the hole injecting layer 31, the hole transport layer 32, the light-emitting layer 33, the electron transport layer 34, and the electron injecting layer 35 are provided, as described above.

The organic EL display device 100 illustrated in FIGS. 4 and 5 is provided with the organic EL element 10 that emits white light as a light-emitting element. In the organic EL display device 100, the organic EL layer 3 containing the light-emitting layer 33 is provided continuously over a plurality of pixels 100R, 100G, and 100B (i.e., over the whole of the pixels).

The organic EL display device 100 is provided with a sealing body 5 (sealing member) that is bonded so as to be opposite to the substrate 1, as illustrated in FIG. 5. As the sealing body 5, for example, a sealing substrate formed from an insulating substrate such as a glass substrate and a plastic substrate is used.

A sealing material not illustrated in the drawings is provided between the substrate 1 and the sealing body 5 so as to surround a display region. For example, a region surrounded by the substrate 1, the sealing body 5, and the sealing material is filled with a filling material 6.

On a surface of the sealing body 5, for example, a CF 51R is provided as a CF that transmits red light so as to correspond to the pixel 100R configured to display red color, and a CF 51G is provided as CF that transmits green light so as to correspond to the pixel 100G configured to display green color. A CF 51B is provided as a CF that transmits blue light so as to correspond to the pixel 100B configured to display blue color. A black matrix (BM) 52 is provided between CFs 51R, 51G, and 51B. The BM 52 prevents entry of light from the external to each gap between the CFs 51R, 51G, and 51B and leakage of light from each gap between the CFs 51R, 51G, and 51B.

When the CFs 51R, 51G, and 51B of red (R), green (G), and blue (B) are used as described above, white light can be modulated into light of red, green, or blue color to be emitted from the pixel 100R, 100G or 100B. Therefore, even when the organic EL element 10 of each of the pixels 100R, 100G, and 100B emits white light, color display can be achieved.

When monochromatic light emission is used or the organic EL element 10 of each of the pixels 100R, 100G and 100B displays a desired color including red, green, and blue, the CF can be omitted. When the organic EL element 10 that displays a desired color and the CF are used in combination, hue shift due to improvement in color purity of each color or change in viewing angle may be suppressed.

In the present embodiment, a case where for example, the sealing substrate is used as the sealing body 5 is described as an example. The present embodiment is not limited to the case. The sealing body 5 may be a sealing layer including an organic insulating layer, an inorganic insulating layer, and the like.

In a case where the organic EL element 10 is developed for display applications, as described above, the organic EL element 10 of white light emission and a color filter (CF) layer are combined to select a color of emitted light in each pixel. Thus, full color image display can be achieved.

When the thickness of the positive electrode 2 is changed, as described in the first embodiment, the organic EL element 10 can display a color other than white. When a microcavity structure (optical microresonator structure) that express a microcavity effect is introduced into each of the pixels 100R, 100G, and 100B, full color image display can be achieved.

The microcavity effect is a phenomenon where emitted light is multiply reflected between the positive electrode 2 and the negative electrode 4 and resonated to make the emission spectrum steep and the emission intensity of peak wavelength is amplified.

The distance between a reflective electrode constituting a pair of electrodes (i.e., the positive electrode 2 and the negative electrode 4) sandwiching the functional layer containing the light-emitting layer 33 and a translucent electrode used as a light-transmitting electrode is set to match the wavelength of light to be enhanced. Thus, the microcavity effect can be obtained. Of light emitted by the light-emitting layer 33, a light component in which the wavelength shifts is multiply reflected between the reflective electrode and the translucent electrode many times, and resonated. As a result, the light component of which the wavelength is enhanced to a desired wavelength is emitted. When the microcavity structure is introduced into each of the pixels 100R, 100G, and 100B for each color of emitted light, the optical path length of the organic EL element 10 in each of the pixels 100R, 100G, and 100B is changed. Thus, full color image display can be achieved.

In a case of the organic EL element 10 having the microcavity structure, the light emission intensity from the organic EL element 10 and the color purity are improved as compared with an organic EL element having no microcavity structure. Therefore, the light-emitting efficiency can be enhanced.

When the microcavity structure is introduced into each of the pixels 100R, 100G, and 100B, the spectrum of light emitted from the organic EL element 10 can be adjusted by using the CF.

Examples of a method for changing the optical path length of the organic EL element 10 in each of the pixels 100R, 100G, and 100B for each color of emitted light include a method for layering the organic EL layer 3 containing the light-emitting layer 33 and the transparent electrode between the reflective electrode and the translucent electrode. In a case of the top-emitting organic EL element 10, examples of the method include a method in which the positive electrode 2 has a layered structure of the non-translucent electrode 21 including a reflective electrode and the light-transmitting electrode 22 including a transparent electrode and the thickness of the light-transmitting electrode 22 on the non-translucent electrode 21 in the positive electrode 2 is changed for each pixel, as illustrated in FIG. 4.

In a case of the top-emitting organic EL element 10, the positive electrode 2 has a layered structure of the non-translucent electrode 21 including a reflective electrode and the light-transmitting electrode 22 including a transparent electrode, the thickness of the light-transmitting electrode 22 is set by patterning each of the pixels 100R, 100G, and 100B such that the spectrum of each color is enhanced due to the microcavity structure, and for example, a translucent silver thin film or the like is used for the negative electrode 4 as the translucent electrode. Thus, the microcavity structure can be introduced into the organic EL element 10.

Hereinafter, a case where the microcavity structure is introduced into each of the pixels 100R, 100G, and 100B, the CF is used in combination, and full color image display can be achieved is described as an example. The configuration of the organic EL element 10 used in the organic EL display device 100 according to the present embodiment is described specifically by using Example. In the following Example, a part of components will be described by using specific dimensions and materials as examples. However, the present embodiment is not also limited to the following Example.

Example 4

In Example 4, the non-translucent electrode 21, the light-transmitting electrode 22, the hole injecting layer 31, the hole transport layer 32, the first light-emitting layer 33*a*, the second light-emitting layer 33*b*, the third light-emitting layer 33c, the electron transport layer 34, the electron injecting layer 35, and the negative electrode 4 are layered in this order on the substrate 1, as illustrated in FIG. 4.

As the substrate 1, a glass substrate is used. Materials for the layers layered on the substrate 1 and thicknesses thereof are as follows.

Non-translucent electrode 21 (positive electrode 2, reflective electrode): Ag (100 nm)

Light-transmitting electrode 22 (positive electrode 2): ITO (pixel 100R: 30 nm, pixel 100G: 120 nm, pixel 100B: 80 nm)

Hole injecting layer 31: HAT-CN (10 nm)

Hole transport layer 32: α-NPD (20 nm)

First light-emitting layer 33a (blue light-emitting layer, light-emitting layer 33): BH1 (host material, 90%)/BD1 (TTF material, 10%) (5 nm)

Second light-emitting layer 33b (green light-emitting layer, light-emitting layer 33): BCP (host material, 50%)/PXZ-DPS (TADF material, 50%) (10 nm)

Third light-emitting layer 33c (red light-emitting layer, light-emitting layer 33): BCP (host material, 90%)/DCM (fluorescent material, 10%) (20 nm)

Electron transport layer 34: Bphen (30 nm)

Electron injecting layer 35: LiF (1 nm)

Negative electrode 4 (translucent electrode): Ag—Mg alloy (Ag/Mg mixing ratio=0.9/0.1) (20 nm)

The organic EL element 10 in Example 4 is the same as the organic EL element 10 in Example 1 except that the thickness of the light-transmitting electrode 22 in the positive electrode 2 at each of the pixels 100R, 100G, and 100B is changed.

Therefore, according to Example 4, the same effects as those in Example 1 can be obtained, and the microcavity structure can be introduced into each of the pixels 100R, 100G and 100B.

Fourth Embodiment

Further another embodiment of the disclosure will be described as follows, with reference to FIG. 6.

The present embodiment will be described about differences between the present embodiment and the first to third embodiments. Components having the same functions as those of the components described in the first embodiment are appended with the same reference signs, and the description thereof is omitted.

Figure 6:
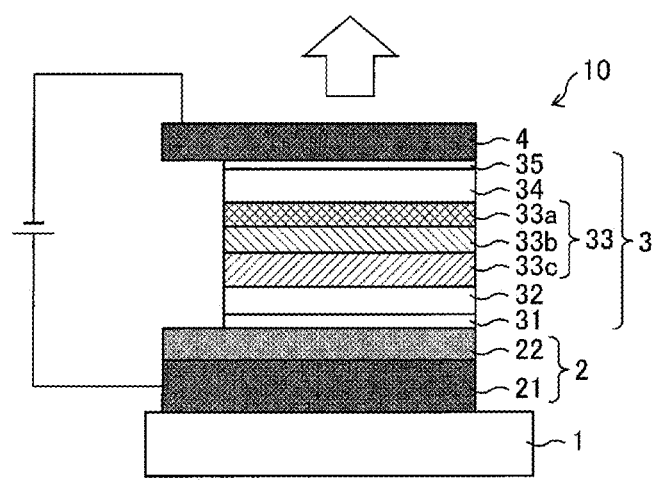
FIG. 6 is a cross-sectional view of an example of a schematic configuration of a light-emitting element according to a fourth embodiment of the disclosure.

FIG. 6 is a cross-sectional view of an example of a schematic configuration of a light-emitting element according to the present embodiment. In the present embodiment, the organic EL element 10 will be described as an example of the light-emitting element according to the present embodiment.

In the organic EL element 10 according to the present embodiment, the first light-emitting layer 33a (first light-emitting layer), the second light-emitting layer 33b (second light-emitting layer), and the third light-emitting layer 33c (third light-emitting layer) are layered between the first electrode and the second electrode in this order from the first electrode side. In first to third embodiments, the first electrode is the positive electrode 2, and in the present embodiment, the first electrode is the negative electrode 4. Therefore, the organic EL element 10 according to the present embodiment is different from the organic EL element 10 according to each of the first to third embodiments.

Hereinafter, the organic EL element 10 according to the present embodiment will be described in detail as an example of the organic EL element 10 illustrated in FIG. 6.

As illustrated in FIG. 6, the organic EL element 10 according to the present embodiment has a configuration in which the organic EL layer 3 (organic layer or functional layer) including the first light-emitting layer 33a, the second light-emitting layer 33b, and the third light-emitting layer 33c in this order from the negative electrode 4 side is provided between the positive electrode 2 (second electrode) and the negative electrode 4 (first electrode).

In the present embodiment, for example, the hole injecting layer 31 and the hole transport layer 32 may be provided as the organic EL layer 3 other than the light-emitting layer 33 between the positive electrode 2 and the light-emitting layer 33, or the electron transport layer 34 and the electron injecting layer 35 may be provided between the negative electrode 4 and the light-emitting layer 33.

Therefore, the organic EL element 10 according to the present embodiment has a configuration in which the positive electrode 2, the hole injecting layer 31, the hole transport layer 32, the third light-emitting layer 33c, the second light-emitting layer 33b, the first light-emitting layer 33a, the electron transport layer 34, the electron injecting layer 35, and the negative electrode 4 are layered on the substrate 1 in this order.

In this case, the first light-emitting layer 33a containing a delayed fluorescent material having the shortest wavelength in the organic EL element 10 may be on the negative electrode 4 side, and the third light-emitting layer 33c containing a fluorescent material having the longest wavelength may be on the positive electrode 2 side.

In a case where the layering order of the first light-emitting layer 33a, the second light-emitting layer 33b, and the third light-emitting layer 33c is reversed, as described above, there are advantages in which a decrease in light-emitting efficiency due to absorption of light emitted from the first light-emitting layer 33a into the host material in the third light-emitting layer 33c can be avoided.

The mobility may not necessarily satisfy the condition depending on suitable selection of the host material. It is considered that the layering order is reversed for solution.

In the present embodiment, it is preferable that the first light-emitting layer 33a have high electron-transporting property and the second light-emitting layer 33b and the third light-emitting layer 33c have high hole-transporting property.

Therefore, it is preferable that the first light-emitting layer 33a contain a material having high electron-transporting property (i.e., material in which the electron mobility is higher than the hole mobility) and the second light-emitting layer 33b and the third light-emitting layer 33c contain a material having high hole-transporting property (i.e., material in which the hole mobility is higher than the electron mobility).

Accordingly, when the first light-emitting layer 33a contains the host material, it is desirable that as the host material, the material in which the hole mobility is higher than the electron mobility be used.

As the host material in the second light-emitting layer 33b and the third light-emitting layer 33c, the host material having high hole-transporting property in which the hole mobility is higher than the electron mobility is preferably used. As the host material, for example, a hole-transporting material such as 1,3-bis(carbazol-9-yl)benzene (mCP) is preferably used.

Electrons are efficiently injected or transported from the negative electrode 4 to the first light-emitting layer 33a, and holes are efficiently injected or transported from the positive electrode 2 to the second light-emitting layer 33b through the third light-emitting layer 33c. As a result, recombination of carriers is likely to occur in the vicinity of interface between the first light-emitting layer 33a and the second light-emitting layer 33b. Therefore, a Dexter transition from the TADF material in the second light-emitting layer 33b to the TTF material in the first light-emitting layer 33a is likely to occur. The Dexter transition occurs due to direct contact. However, a Förster transition from the $S_1$ level of the TADF material to the $S_1$ level of the fluorescent material occurs when the materials are within a constant distance without direct contact. Therefore, this configuration makes it possible to emit lights of three colors with efficiency.

Hereinafter, the configuration of the organic EL element 10 according to the present embodiment will be described by using Example. In the following Example, a part of components will be described by using specific dimensions and materials as examples. However, the present embodiment is not also limited to the following Example.

Example 5

In Example 5, the non-translucent electrode 21, the light-transmitting electrode 22, the hole injecting layer 31, the hole transport layer 32, the third light-emitting layer 33c, the second light-emitting layer 33b, the first light-emitting layer 33a, the electron transport layer 34, the electron injecting layer 35, and the negative electrode 4 are layered on the substrate 1 in this order from the substrate 1 side, as illustrated in FIG. 6.

As the substrate 1, a glass substrate is used. Materials for the layers layered on the substrate 1 and thicknesses thereof are as follows.

Non-translucent electrode 21 (positive electrode 2, reflective electrode): Ag (100 nm)
   Light-transmitting 22 (positive electrode 2): ITO (65 nm)
   Hole injecting layer 31: HAT-CN (10 nm)
   Hole transport layer 32: α-NPD (20 nm)
   Third light-emitting layer 33c (red light-emitting layer, light-emitting layer 33): mCP (host material, 90%)/DCM (fluorescent material, 10%) (20 nm)
   Second light-emitting layer 33b (green light-emitting layer, light-emitting layer 33): mCP (host material, 50%)/PXZ-DPS (TADF material, 50%) (10 nm)
   First light-emitting layer 33a (blue light-emitting layer, light-emitting layer 33): BH2 (host material, 90%)/BD2 (TTF material, 10%) (5 nm)
   Electron transport layer 34: Bphen (30 nm)
   Electron injecting layer 35: LiF (1 nm)
   Negative electrode 4 (translucent electrode): Ag—Mg alloy (Ag/Mg mixing ratio=0.9/0.1) (20 nm)

The organic EL element 10 in Example 5 is the same as the organic EL element 10 in Example 1 except that the materials in the first light-emitting layer 33a, the second light-emitting layer 33b, and the third light-emitting layer 33c are changed and the layering order is changed.

For the first light-emitting layer 33a, as a TTF material and a host material, delayed fluorescent materials that cause TTF from the $T_1$ level of BH2 that is the host material to the $S_1$ level of BD2 that is the dopant material (TTF material) are used in combination. Of the combination of the dopant material and the host material that cause a TTF phenomenon, a host material that satisfies the conditions described above for carrier-transporting properties and energy levels is selected, and a dopant material suitable for the host material is selected.

The $T_1$ level of BH2 is lower than the $T_1$ level of PXZ-DPS that is the dopant material (TADF material) of the second light-emitting layer 33b. The $S_1$ level of BD2 is higher than the $T_1$ level of BH2.

In Example 5, since the $T_1$ level of BH2 is lower than the $T_1$ level of the TADF material, Dexter energy transfer from the TADF material to at least one of BH2 and BD2 occurs, and due to TTF, upconversion from the $T_1$ level of the BH2 or the $T_1$ level of BD2 to the $S_1$ level of BD2 occurs. In the present embodiment, BD2 having a $S_1$ level higher than the $S_1$ level of the dopant material (TADF material) of the second light-emitting layer 33b is made to emit light by using delayed fluorescence due to the TTF phenomenon, as described above.

At that time, the $T_1$ level of BD2 is higher than the $T_1$ level of BH2. Therefore, triplet excitons of BH2 are not transferred to BD2, triplet excitons generated in BD2 are transferred as energy to BH2, and due to the TTF phenomenon, the triplet excitons collide with each other on BH2 with efficiency, to generate singlet excitons. The singlet excitons generated due to the TTF phenomenon are transferred as energy from BH2 to BD2 that emits light, and contribute to fluorescence emission of BD2.

The host material (BH2) contained in the first light-emitting layer 33a in this Example has an electron mobility higher than the hole mobility, and the host material contained in the second light-emitting layer 33b and the host material (mCP) contained in the third light-emitting layer 33c have a hole mobility higher than the electron mobility. Therefore, for transporting properties of the host materials, the first light-emitting layer 33a has high electron-transporting property and the second light-emitting layer 33b and the third light-emitting layer 33c have high hole-transporting property.

The LUMO Level of BH2 and the LUMO level of BD2 are higher than the LUMO level of the host material and the LUMO level of the dopant material in the second light-emitting layer 33b. The HOMO level of BH2 and the HOMO level of BD2 are lower than the HOMO level of the host material and the HOMO level of the dopant material in the second light-emitting layer 33b. Therefore, electrons are more easily injected into the second light-emitting layer 33b than the first light-emitting layer 33a, and electrons are hardly leaked from the second light-emitting layer 33b to the first light-emitting layer 33a.

The HOMO level of the host material and the HOMO level of the dopant material in the second light-emitting layer 33b are higher than the HOMO level of the host material and the HOMO level of the dopant material in the third light-emitting layer 33c. The LUMO level of the host material and the LUMO level of the dopant material in the second light-emitting layer 33b are lower than the LUMO level of the host material and the LUMO level of the dopant material in the third light-emitting layer 33c. Therefore, holes are more easily injected into the second light-emitting layer 33b than the third light-emitting layer 33c, and holes are hardly leaked from the second light-emitting layer 33b to the third light-emitting layer 33c.

In Example 5, each layer in the light-emitting layer 33 can be made to emit light with efficiency, like Example 1.

Fifth Embodiment

Still another embodiment of the disclosure will be described as follows, with reference to FIGS. 7 and 8.

The present embodiment will be described about differences between the present embodiment and the first to fourth embodiments by using differences between the present embodiment and the first embodiment. Obviously, the same modifications as those of the first to fourth embodiments may be also applied to the present embodiment. Components having the same functions as those of the components described in the first to fourth embodiments are appended with the same reference signs, and the description thereof is omitted.

Figure 7:
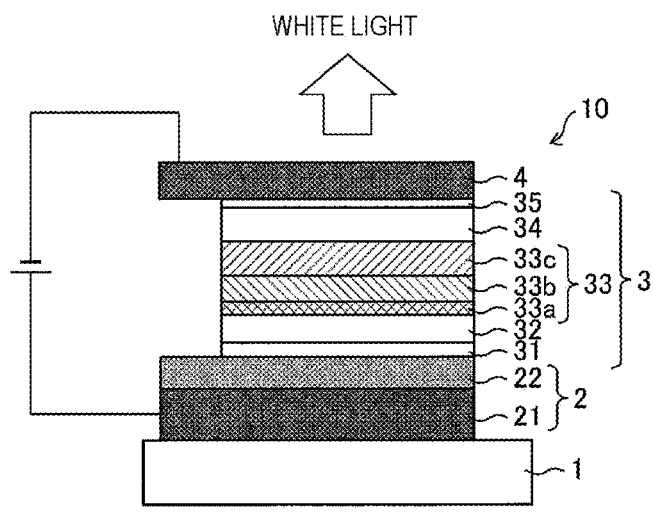
FIG. 7 is a cross-sectional view of an example of a schematic configuration of a light-emitting element according to a fifth embodiment of the disclosure.

FIG. 7 is a cross-sectional view of an example of a schematic configuration of a light-emitting element according to the present embodiment. FIG. 8 is a view illustrating an energy diagram of each of layers between which the first light-emitting layer (first light-emitting layer 33a) is provided in the light-emitting element according to the present embodiment. In the present embodiment, the organic EL element 10 will be described as an example of the light-emitting element according to the present embodiment.

As described above, a Dexter transition occurs only between adjacent molecules. Therefore, as the thickness of the first light-emitting layer 33a is larger, the light-emitting efficiency is decreased. Accordingly, the thickness of the first light-emitting layer 33a is preferably not greater than 5 nm, and more preferably less than 5 nm.

When the first light-emitting layer 33a is a layer in which the content of the TTF material is high and the thickness is extremely small, a Dexter transition from the $T_1$ level of the TADF material in the second light-emitting layer 33b to the $T_1$ level of the TTF material in the first light-emitting layer 33a is likely to occur, and light emission can be more efficiently achieved in the first light-emitting layer 33a.

It is desirable that the content of the TTF material in the first light-emitting layer 33a be greater than 50%. It is more desirable that the first light-emitting layer 33a be formed from the dopant material alone.

When the TTF material used in the first light-emitting layer 33a is a delayed fluorescent material that may cause a TTF phenomenon alone, use of a dopant film that is very thin for the first light-emitting layer 33a, as illustrated in FIG. 7, can transfer excitation energy directly from the TADF material in the second light-emitting layer 33b to the TTF material (dopant material) in the first light-emitting layer 33a due to the Dexter transition. When the first light-emitting layer 33a is formed from the dopant material alone, a combination of the host material and the dopant material does not need to be considered. Further, loss during transfer of excitation energy between the host material and the dopant material can be decreased.

However, when the thickness of the first light-emitting layer 33a is very small (e.g., approximately 1 nm) such that the layer is not uniformly formed, the first light-emitting layer 33a may not exist locally, and a functional layer layered on a side opposite to the second light-emitting layer 33b with the first light-emitting layer 33a interposed between the functional layer and the second light-emitting layer 33b may be in direct contact with the second light-emitting layer 33b.

For example, in a case of the first light-emitting layer 33a that is a thin dopant film having an average thickness of approximately 0.5 nm, a film having a thickness greater than the thickness that is targeted to a monomolecular size (e.g., in a case of film formation by vapor deposition, a film is formed by vapor deposition in a very short time, or in a case of film formation by coating, a film is formed by using a solution of extremely low concentration) is formed. In this case, each molecule of the TTF material is disposed in an island shape. As a result, the first light-emitting layer 33a is also formed in an island shape, as illustrated in FIG. 8.

In a case of the first light-emitting layer 33a that has an island shape and is thin, it is necessary that carriers be trapped by an interface between the second light-emitting layer 33b and the first light-emitting layer 33a or by an interface between the second light-emitting layer 33b and a functional layer layered on the first light-emitting layer 33a on a side opposite to the second light-emitting layer 33b with the first light-emitting layer 33a interposed between the second light-emitting layer 33b and the functional layer, such that the carriers are not leaked to the first light-emitting layer 33a or a side of the functional layer layered on the side to opposite to the second light-emitting layer 33b with the first light-emitting layer 33a interposed between the functional layer and the second light-emitting layer 33b.

In the present embodiment, not only a relationship between the HOMO level and LUMO level of a material that is contained in the first light-emitting layer 33a at least at the highest mixing ratio and the HOMO level and LUMO level of a material that is contained in the second light-emitting layer 33b at least at the highest mixing ratio, but also a relationship between the HOMO level and LUMO level of the material that is contained in the second light-emitting layer 33b at least at the highest mixing ratio and the HOMO level and LUMO level of a material that is contained in the functional layer layered on the first light-emitting layer 33a on the side opposite to the second light-emitting layer 33b with the first light-emitting layer 33a interposed between the second light-emitting layer 33b and the functional layer are important.

Figure 8:
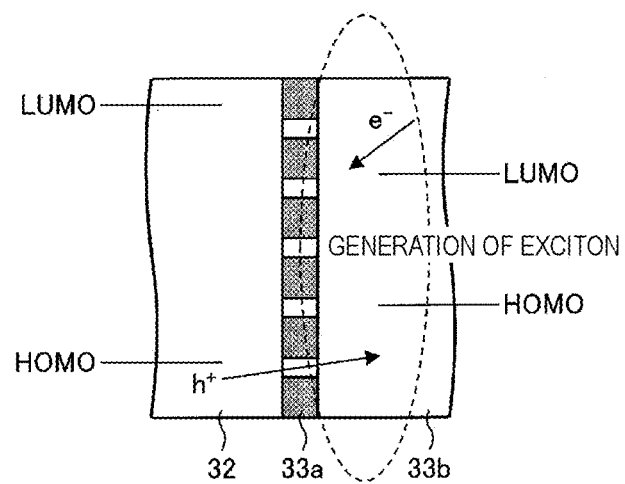
FIG. 8 are a view illustrating an energy diagram of each of layers between which a first light-emitting layer is provided in the light-emitting element according to the fifth embodiment of the disclosure.

Therefore, in a case of the examples illustrated in FIGS. 7 and 8, a relationship between the HOMO level and LUMO level of the material in the hole transport layer 32 and the HOMO level and LUMO level of the host material in the second light-emitting layer 33b is important for prevention of leakage of carriers to the hole transport layer 32 side.

When the first light-emitting layer 33a is an extremely thin dopant film having an average thickness of approximately 0.5 nm, as described above, the material contained in the first light-emitting layer 33a at the highest mixing ratio is a TTF material.

Therefore, in the present embodiment, it is desirable that the HOMO level of the TTF material in the first light-emitting layer 33a be lower than the HOMO level of the material contained in the second light-emitting layer 33b at least at the highest mixing ratio (e.g., When the second light-emitting layer 33b contains the host material, the material is the host material or the host material and the dopant material, when the second light-emitting layer 33b is formed from the dopant material alone, the material is the TADF material). It is desirable that the LUMO level of the TTF material in the first light-emitting layer 33a be higher than the LUMO level of the material contained in the second light-emitting layer 33b at least at the highest mixing ratio.

When the HOMO level of the TTF material in the first light-emitting layer 33a is lower than the HOMO level of the material contained in the second light-emitting layer 33b at least at the highest mixing ratio, holes are hardly leaked to the first light-emitting layer 33a side in a region adjacent to the first light-emitting layer 33a and the second light-emitting layer 33b. Carrier can be trapped by the interface between the first light-emitting layer 33a and the second light-emitting layer 33b.

When the LUMO level of the TTF material in the first light-emitting layer 33a is higher than the LUMO level of the material contained in the second light-emitting layer 33b at least at the highest mixing ratio, electrons are hardly leaked to the first light-emitting layer 33a side in a region adjacent to the first light-emitting layer 33a and the second light-emitting layer 33b. Carrier can be trapped by the interface between the first light-emitting layer 33a and the second light-emitting layer 33b.

In the present embodiment, it is desirable that the HOMO level of a material contained in a layer layered on the first light-emitting layer 33a on the side opposite to the second light-emitting layer 33b with the first light-emitting layer 33a interposed between the second light-emitting layer 33b and the layer (e.g., the hole transport layer 32) be lower than the HOMO level of the material contained in the second light-emitting layer 33b at least at the highest mixing ratio, as illustrated in FIG. 8.

When the layer layered on the first light-emitting layer 33a on the side opposite to the second light-emitting layer 33b with the first light-emitting layer 33a interposed between the second light-emitting layer 33b and the layer is, for example, the hole transport layer 32, the first light-emitting layer 33a has an island shape, and holes are hardly leaked from the second light-emitting layer 33b to the hole transport layer 32 in a region where the second light-emitting layer 33b is in contact with the hole transport layer 32. Carriers can be trapped by an interface between the second light-emitting layer 33b and the hole transport layer 32.

As illustrated in FIG. 8, it is desirable that the LUMO level of the material contained in the layer layered on the first light-emitting layer 33a on the side opposite to the second light-emitting layer 33b with the first light-emitting layer 33a interposed between the second light-emitting layer 33b and the layer (e.g., the hole transport layer 32) be higher than the LUMO level of the material contained in the second light-emitting layer 33b at least at the highest mixing ratio.

When the layer layered on the first light-emitting layer 33a on the side opposite to the second light-emitting layer 33b with the first light-emitting layer 33a interposed between the second light-emitting layer 33b and the layer is, for example, the hole transport layer 32, the first light-emitting layer 33a has an island shape, and electrons are hardly leaked from the second light-emitting layer 33b to the hole transport layer 32 in the region where the second light-emitting layer 33b is in contact with the hole transport layer 32. Carriers can be trapped by an interface between the second light-emitting layer 33b and the hole transport layer 32.

Hereinafter, the configuration of the organic EL element 10 according to the present embodiment will be described by using Example. In the following Example, a part of components will be described by using specific dimensions and materials as examples. However, the present embodiment is not also limited to the following Examples.

Example 6

In Example 6, the non-translucent electrode 21, the light-transmitting electrode 22, the hole injecting layer 31, the hole transport layer 32, the third light-emitting layer 33c, the second light-emitting layer 33b, the first light-emitting layer 33a, the electron transport layer 34, the electron injecting layer 35, and the negative electrode 4 are layered on the substrate 1 in this order from the substrate 1 side, as illustrated in FIG. 7.

As the substrate 1, a glass substrate is used. Materials for the layers layered on the substrate 1 and thicknesses thereof are as follows.

Non-translucent electrode 21 (positive electrode 2, reflective electrode): Ag (100 nm)
  Light-transmitting 22 (positive electrode 2): ITO (65 nm)
  Hole injecting layer 31: HAT-CN (10 nm)
  Hole transport layer 32: α-NPD (20 nm)
  First light-emitting layer 33a (blue light-emitting layer, light-emitting layer 33): BD3 (TTF material, 0.5 nm)
  Second light-emitting layer 33b (green light-emitting layer, light-emitting layer 33): BCP (host material, 50%)/PXZ-DPS (TADF material, 50%) (10 nm)
  Third light-emitting layer 33c (red light-emitting layer, light-emitting layer 33): BCP (host material, 90%)/DCM (fluorescent material, 10%) (20 nm)
  Electron transport layer 34: Bphen (30 nm)
  Electron injecting layer 35: LiF (1 nm)
  Negative electrode 4 (translucent electrode): Ag—Mg alloy (Ag/Mg mixing ratio=0.9/0.1) (20 nm)

BD3 is a TTF material that has a HOMO level lower than that of BCP and a LUMO level higher than that of BCP and in which a TTF phenomenon may be caused by using a dopant material alone without a host material.

The organic EL element 10 in Example 6 is the same as the organic EL element 10 in Example 1 except that the first light-emitting layer 33a is an extremely thin dopant film formed from the BD3 alone.

According to the present embodiment, the effects as those in Example 1 can be obtained. Further, excitation energy can be transferred directly from the TADF material in the second light-emitting layer 33b to the TTF material in the first light-emitting layer 33a due to a Dexter transition. Therefore, loss during accepting the excitation energy between the host material and the dopant material can be decreased.

The $T_1$ level of BD3 is lower than the $T_1$ level of PXZ-DPS that is the dopant material (TADF material) in the second light-emitting layer 33b. Therefore, Dexter energy transfer from the dopant material (TADF material) in the second light-emitting layer 33b to BD3 occurs, and upconversion from the $T_1$ level to the $S_1$ of BD3 is caused by TTF. In the present embodiment, BD3 having a $S_1$ level higher than the $S_1$ level of the dopant material (TADF material) in the second light-emitting layer 33b is made to emit light by using delayed fluorescence due to the TTF phenomenon, as described above.

In Example 6, as the host materials in the second light-emitting layer 33b and the third light-emitting layer 33c, the same host material as that in Example 1 is used.

The HOMO level of BD3 is lower than the HOMO level of the host material and the HOMO level of the dopant material in the second light-emitting layer 33b. The LUMO level of BD3 is higher than the LUMO level of the host material and the LUMO level of the dopant material in the second light-emitting layer 33b. Therefore, holes are more easily injected into the second light-emitting layer 33b than the first light-emitting layer 33a, and electrons are hardly leaked from the second light-emitting layer 33b to the first light-emitting layer 33a.

The LUMO level of the host material and the LUMO level of the dopant material in the second light-emitting layer 33b are lower than the LUMO level of the host material and the LUMO level of the dopant material in the third light-emitting layer 33c. The HOMO level of the host material and the HOMO level of the dopant material in the second light-emitting layer 33b are higher than the HOMO level of the host material and the HOMO level of the dopant material in the third light-emitting layer 33c. Therefore, electrons are more easily injected into the second light-emitting layer 33b than the third light-emitting layer 33c, and holes are hardly leaked from the second light-emitting layer 33b to the third light-emitting layer 33c.

The HOMO level of the hole transport layer 32 (α-NPD) adjacent to the first light-emitting layer 33a is lower than the HOMO level of BCP that is the host material in the second light-emitting layer 33b, and the LUMO level of the α-NPD is higher than the LUMO level of BCP. Therefore, carrier leakage from the second light-emitting layer 33b to the hole transport layer 32 can be prevented or suppressed.

Sixth Embodiment

Further another embodiment of the disclosure will be described as follows, with reference to FIG. 9.

The present embodiment will be described about differences between the present embodiment and the first to fifth embodiments by using differences between the present embodiment and the first embodiment. Obviously, the same modifications as those of the first to fifth embodiments may also be applied to the present embodiment. The present embodiment will be described about differences between the present embodiment and the first to fifth embodiments, and components having the same functions as those of the components described in the first embodiment are appended with the same reference signs, and the description thereof is omitted.

Figure 9:
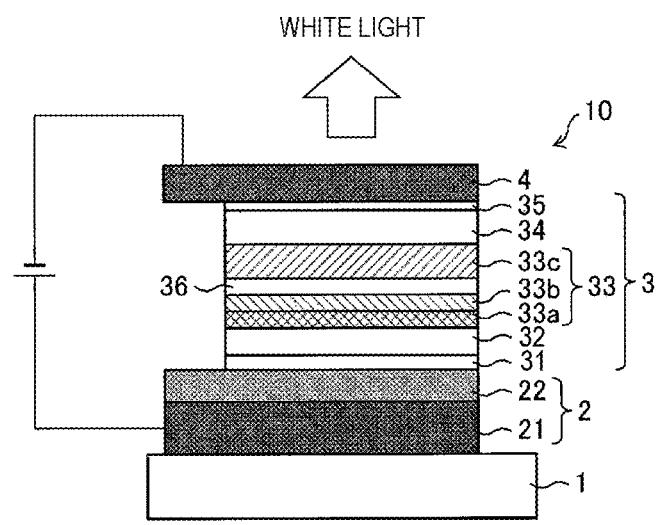
FIG. 9 is a cross-sectional view of an example of a schematic configuration of a light-emitting element according to a sixth embodiment of the disclosure.
Figure 10A:
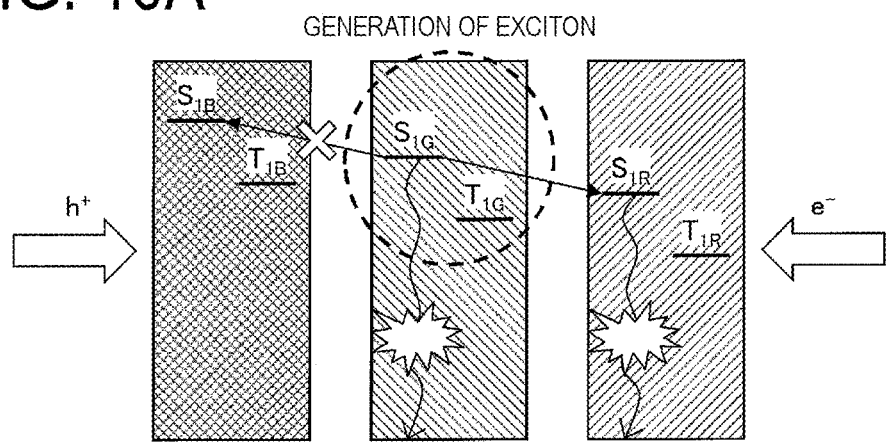
FIGS. 10A and 10B are each a view illustrating a problem of known light-emitting element in which red, green, and blue light-emitting layers are simply layered.
Figure 10B:
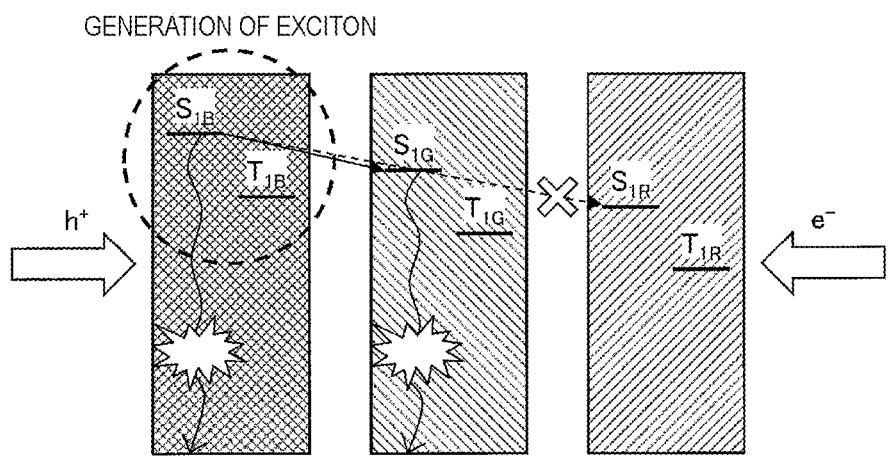
Figure 11A:
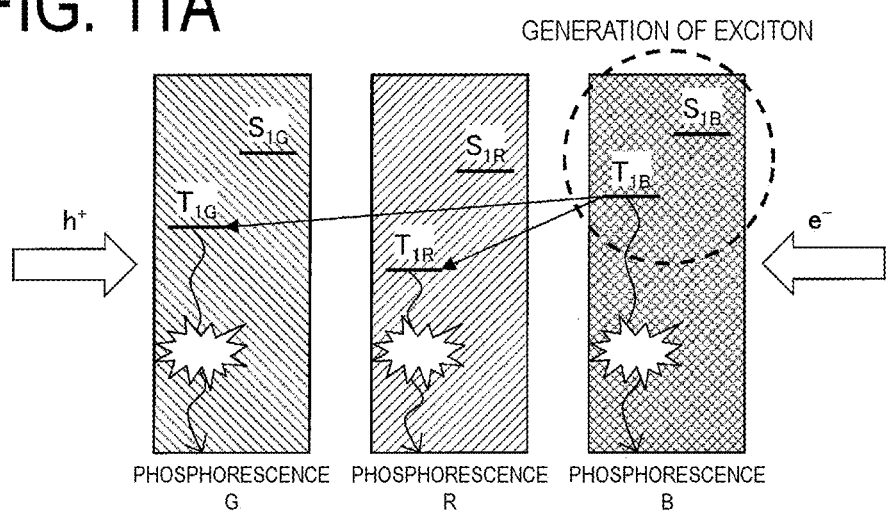
FIGS. 11A and 11B are each a view illustrating the principle of light emission of the light-emitting element described in PTL 1.
Figure 11B:
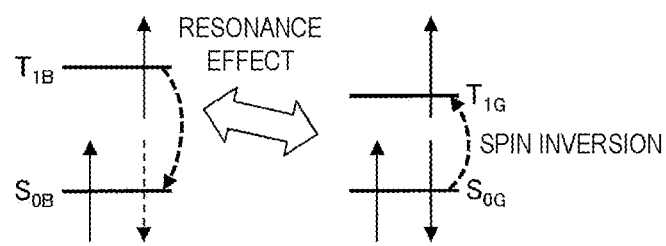

FIG. 9 is a cross-sectional view of an example of a schematic configuration of a light-emitting element according to the present embodiment. In the present embodiment, the organic EL element 10 will be described as an example of the light-emitting element according to the present embodiment.

As illustrated in FIG. 9, the organic EL element 10 according to the present embodiment has a configuration in which a buffer layer 36 (intermediate layer) containing no fluorescent material is provided between the second light-emitting layer 33b and the third light-emitting layer 33c.

As described above, transfer of excitation energy between the second light-emitting layer 33b and the third light-emitting layer 33c is caused by Förster energy transfer that does not need direct contact. Therefore, the buffer layer 36 containing no fluorescent material may be provided between the second light-emitting layer 33b and the third light-emitting layer 33c, as described above.

When a material for the buffer layer 36 is appropriately selected, carrier balance can be controlled by a difference of carrier (hole or electron) mobility or the size of barrier.

Therefore, when the buffer layer 36 is provided between the second light-emitting layer 33b and the third light-emitting layer 33c, as described above, the difference of carrier (hole or electron) mobility and the size of barrier between the second light-emitting layer 33b and the third light-emitting layer 33c can be changed, and the carrier balance can be controlled.

According to the present embodiment, excitons can be certainly generated in the second light-emitting layer 33b. When excitons can be certainly generated in the second light-emitting layer 33b, fluorescence can be emitted by the first light-emitting layer 33a due to a Dexter transition and TTF, as described above, and fluorescence can be emitted in the third light-emitting layer 33c due to a Förster transition. According to the present embodiment, light emission can be efficiently caused in each layer (i.e., the first light-emitting layer 33a, the second light-emitting layer 33b, and the third light-emitting layer 33c) in the light-emitting layer 33, and the light-emitting efficiency in each layer in the light-emitting layer 33 can be enhanced.

When the buffer layer 36 is thus provided between the second light-emitting layer 33b and the third light-emitting layer 33c, it is desirable that the total thickness of the second light-emitting layer 33b and the buffer layer 36 be not greater than 20 nm.

A Förster transition from the $S_1$ level of the TADF material contained in the second light-emitting layer 33b to the $S_1$ level of the fluorescent material contained in the third light-emitting layer 33c occurs when the materials are within a constant distance without direct contact. When light-emitting layers having different emission peak wavelengths are layered, excitation energy is easily transferred from the light-emitting layer having the shorter emission peak wavelength to the light-emitting layer having the longer emission peak wavelength. When a distance between a molecule of the TADF material contained in the second light-emitting layer 33b and a molecule of the fluorescent material contained in the third light-emitting layer 33c is not greater than 20 nm, the Förster transition easily and certainly occurs, and the energy transfer efficiency is not deteriorated.

Hereinafter, the configuration of the organic EL element 10 according to the present embodiment will be described by using Example. In the following Example, a part of components will be described by using specific dimensions and materials as examples. However, the present embodiment is not also limited to the following Example.

Example 7

In Example 7, the non-translucent electrode 21, the light-transmitting electrode 22, the hole injecting layer 31, the hole transport layer 32, the first light-emitting layer 33a, the second light-emitting layer 33b, the buffer layer 36, the third light-emitting layer 33c, the electron transport layer 34, the electron injecting layer 35, and the negative electrode 4 are layered on the substrate 1 in this order from the substrate 1 side, as illustrated in FIG. 9.

As the substrate 1, a glass substrate is used. Materials for the layers layered on the substrate 1 and thicknesses thereof are as follows.

Non-translucent electrode 21 (positive electrode 2, reflective electrode): Ag (100 nm)

Light-transmitting 22 (positive electrode 2): ITO (65 nm)

Hole injecting layer 31: HAT-CN (10 nm)

Hole transport layer 32: α-NPD (20 nm)

First light-emitting layer 33a (blue light-emitting layer, light-emitting layer 33): BH1 (host material, 90%)/BD1 (TTF material, 10%) (5 nm)

Second light-emitting layer 33b (green light-emitting layer, light-emitting layer 33): BCP (host material, 50%)/PXZ-DPS (TADF material, 50%) (10 nm)

Buffer layer 36: BCP (5 nm)

Third light-emitting layer 33c (red light-emitting layer, light-emitting layer 33): BCP (host material, 90%)/DCM (fluorescent material, 10%) (20 nm)

Electron transport layer 34: Bphen (30 nm)

Electron injecting layer 35: LiF (1 nm)

Negative electrode 4 (translucent electrode): Ag—Mg alloy (Ag/Mg mixing ratio=0.9/0.1) (20 nm)

As described above, the organic EL element 10 in Example 7 has the same as the organic EL element 10 in Example 1 except that the buffer layer 36 is provided between the second light-emitting layer 33b and the third light-emitting layer 33c.

According to Example 7, the same effects as those in Example 1 can be obtained. Further, carrier balance between the second light-emitting layer 33b and the third light-emitting layer 33c can be controlled. Therefore, excitons can be more certainly generated in the second light-emitting layer 33b.

Supplement

A light-emitting element (the organic EL element 10) according to a first aspect of the disclosure is a light-emitting element in which a functional layer (the organic EL layer 3) containing at least a first light-emitting layer (the first light-emitting layer 33a), a second light-emitting layer (the second light-emitting layer 33b), and a third light-emitting layer (the third light-emitting layer 33c) is provided between a first electrode (one of the positive electrode 2 and the negative electrode 4) and a second electrode (the other of the positive electrode 2 and the negative electrode 4). The first light-emitting layer has the shortest emission peak wavelength of the light-emitting layers, and contains (I) a host material and (II) a TTF material that is a delayed fluorescent material that causes a TTF phenomenon in cooperation with the host material or by the TTF material alone, or contains at least the TTF material. The second light-emitting layer is layered on the first light-emitting layer between the first light-emitting layer and the third light-emitting layer, and contains at least a thermally activated delayed fluorescent material. The third light-emitting layer has the longest emission peak wavelength of the light-emitting layers, and contains at least a fluorescent material. The excited triplet level of at least one of the host material and the TTF material contained in the first light-emitting layer is lower than the excited triplet level of the thermally activated delayed fluorescent material contained in the second light-emitting layer.

As the emission peak wavelength is shorter, the energy level of the light-emitting material is higher. When light-emitting layers having different emission peak wavelengths are layered, excitation energy is easily transferred from the light-emitting layer having the shorter emission peak wavelength to the light-emitting layer having the longer emission peak wavelength. In the thermally activated delayed fluorescent material (TADF material), excitons can be freely transferred between the $S_1$ level and the $T_1$ level. Therefore, excitons are generated uniformly in the $S_1$ level and the $T_1$ level of the thermally activated delayed fluorescent material. This configuration causes Förster energy transfer (Förster transition) from the thermally activated delayed fluorescent material in the second light-emitting layer to the fluorescent material in the third light-emitting layer.

The $T_1$ level of at least one of the host material and the TTF material contained in the first light-emitting layer is lower than the $T_1$ level of the thermally activated delayed fluorescent material contained in the second light-emitting layer. Therefore, excitation energy is easily transferred from the thermally activated delayed fluorescent material in the second light-emitting layer to the host material or the TTF material contained in the first light-emitting layer. At that time, the second light-emitting layer is layered on the first light-emitting layer (that is, the second light-emitting layer is in contact with the first light-emitting layer). Therefore, Dexter energy transfer from the thermally activated delayed fluorescent material in the second light-emitting layer to the host material or the TTF material in the first light-emitting layer occurs. Due to a TTF phenomenon, re-excitation from the $T_1$ level of the host material or the $T_1$ level of the TTF material to the $S_1$ level of the TTF material occurs in the first light-emitting layer.

According to this configuration, light emission can be efficiently achieved in each of the first light-emitting layer, the second light-emitting layer, and the third light-emitting layer. In the light-emitting element, the fluorescent material containing the delayed fluorescent material is used to emit light, and a phosphorescent material is not used. Therefore, a reduction in cost can be attained.

A light-emitting element according to a second aspect of the disclosure is the light-emitting element according to the first aspect, wherein energy of excitons generated in the second light-emitting layer may be transferred to the first light-emitting layer due to Dexter energy transfer, energy of excitons generated in the second light-emitting layer may be transferred to the third light-emitting layer due to Förster energy transfer, and light emission may be caused in each of the first light-emitting layer, the second light-emitting layer, and the third light-emitting layer.

According to this configuration, light emission can be efficiently achieved in each of the first light-emitting layer, the second light-emitting layer, and the third light-emitting layer, as described above.

The light-emitting element according to a third aspect of the disclosure is the light-emitting element according to the second aspect, wherein the Dexter energy transfer from the excited triplet level of the thermally activated delayed fluorescent material in the second light-emitting layer to the excited triplet level of the TTF material in the first light-emitting layer occurs, re-excitation from the excited triplet level of the TTF material to the excited singlet level of the TTF material occurs, the Förster energy transfer from the excited singlet level of the thermally activated delayed fluorescent material in the second light-emitting layer to the excited singlet level of the fluorescent material in the third light-emitting layer occurs.

According to this configuration, the Dexter energy transfer from the excited triplet level of the thermally activated delayed fluorescent material in the second light-emitting layer to the excited triplet level of the TTF material in the first light-emitting layer occurs. Therefore, in the first light-emitting layer, light emission can be more efficiently achieved. The Förster energy transfer from the excited singlet level of the thermally activated delayed fluorescent material in the second light-emitting layer to the excited singlet level of the fluorescent material in the third light-emitting layer occurs. Therefore, in the third light-emitting layer, light emission can be more efficiently achieved.

A light-emitting element according to a fourth aspect of the disclosure is the light-emitting element according to any one of the first to third aspects, wherein the second light-emitting layer may have a thickness of not greater than 20 nm.

The Förster transition from the $S_1$ level of the thermally activated delayed fluorescent material contained in the second light-emitting layer to the $S_1$ level of the fluorescent material contained in the third light-emitting layer occurs when the materials are within a constant distance without direct contact. When light-emitting layers having different emission peak wavelengths are layered, excitation energy is easily transferred from the light-emitting layer having the shorter emission peak wavelength to the light-emitting layer exhibiting the longer emission peak wavelength. When a distance between a molecule of the thermally activated delayed fluorescent material and a molecule of the fluorescent material is not greater than 20 nm, the Förster transition easily and certainly occurs, and the energy transfer efficiency is not deteriorated.

A light-emitting element according to a fifth aspect of the disclosure includes the light-emitting element according to any one of the first to fourth aspects, wherein the first electrode may be a positive electrode, the first light-emitting layer, the second light-emitting layer, and the third light-emitting layer may be layered in this order from the first electrode side, the first light-emitting layer may contain a material having a hole mobility higher than the electron mobility, and the second light-emitting layer and the third light-emitting layer may contain a material having an electron mobility higher than the hole mobility.

According to this configuration, holes are efficiently injected or transported from the first electrode to the first light-emitting layer, and electrons are efficiently injected or transported from the second electrode to the second light-emitting layer through the third light-emitting layer. Therefore, recombination of carriers is likely to occur in the vicinity of interface between the first light-emitting layer and the second light-emitting layer. Accordingly, the exciton generation probability in the second light-emitting layer is increased, and a Dexter transition from the thermally activated delayed fluorescent material in the second light-emitting layer to the TTF material in the first light-emitting layer is likely to occur. While the Dexter transition occurs due to direct contact, a Förster transition from the $S_1$ level of the thermally activated delayed fluorescent material to the $S_1$ level of the fluorescent material occurs when the materials are within a constant distance without direct contact. Therefore, lights of three colors can be more efficiently emitted by this configuration.

A light-emitting element according to a sixth aspect of the disclosure is the light-emitting element according to any one of the first to fourth aspects, wherein the first electrode may be a negative electrode, the first light-emitting layer, the second light-emitting layer, and the third light-emitting layer may be layered in this order from the first electrode side, the first light-emitting layer may contain a material having an electron mobility higher than the hole mobility, and the second light-emitting layer and the third light-emitting layer may contain a material having a hole mobility higher than the electron mobility.

According to this configuration, electrons are efficiently injected or transported from the first electrode to the first light-emitting layer, and holes are efficiently injected or transported from the second electrode to the second light-emitting layer through the third light-emitting layer. Therefore, recombination of carriers is likely to occur in the vicinity of interface between the first light-emitting layer and the second light-emitting layer. Accordingly, a Dexter transition from the thermally activated delayed fluorescent material in the second light-emitting layer to the TTF material in the first light-emitting layer is likely to occur. While the Dexter transition occurs due to direct contact, a Förster transition from the $S_1$ level of the thermally activated delayed fluorescent material to the $S_1$ level of the fluorescent material occurs when the materials are within a constant distance without direct contact. Therefore, lights of three colors can be more efficiently emitted by this configuration.

A light-emitting element according to a seventh aspect of the disclosure is the light-emitting element according to any one of the first to sixth aspects, wherein the HOMO level of a material contained in the second light-emitting layer at least at the highest mixing ratio may be higher than the HOMO level of a material contained in the first light-emitting layer at least at the highest mixing ratio.

According to this configuration, when the positive electrode is provided on the first light-emitting layer side as the first or second electrode, holes are more easily injected into the second light-emitting layer than the first light-emitting layer. When the negative electrode is provided on the first light-emitting layer side as the first or second electrode, holes are hardly leaked from the second light-emitting layer to the first light-emitting layer. Therefore, this configuration can enhance the exciton generation probability in the second light-emitting layer. Accordingly, the light-emitting efficiency of the second light-emitting layer can be enhanced. In addition, due to transfer of energy of excitations generated in the second light-emitting layer, light emission can be efficiently achieved also in the first light-emitting layer and the third light-emitting layer.

A light-emitting element according to an eighth aspect of the disclosure is the light-emitting element according to any one of the first to seventh aspects, wherein the HOMO level of the material contained in the second light-emitting layer at least at the highest mixing ratio may be higher than the HOMO level of a material contained in the third light-emitting layer at least at the highest mixing ratio.

According to this configuration, when the positive electrode is provided on the third light-emitting layer side as the first or second electrode, holes are more easily injected into the second light-emitting layer than the third light-emitting layer. When the negative electrode is provided on the third light-emitting layer side as the first or second electrode, holes are hardly leaked from the second light-emitting layer to the third light-emitting layer. Therefore, this configuration can enhance the exciton generation probability in the second light-emitting layer. Accordingly, the light-emitting efficiency of the second light-emitting layer can be enhanced. In addition, due to transfer of energy of excitations generated in the second light-emitting layer, light emission can be efficiently achieved also in the first light-emitting layer and the third light-emitting layer.

A light-emitting element according to a ninth aspect of the disclosure is the light-emitting element according to any one of the first to eighth aspects, wherein the LUMO level of the material contained in the second light-emitting layer at least at the highest mixing ratio may be lower than the LUMO level of the material contained in the first light-emitting layer at least at the highest mixing ratio.

According to this configuration, when the negative electrode is provided on the first light-emitting layer side as the first or second electrode, electrons are more easily injected into the second light-emitting layer than the first light-emitting layer. When the positive electrode is provided on the first light-emitting layer side as the first or second electrode, electrons are hardly leaked from the second light-emitting layer to the first light-emitting layer. Therefore, this configuration can enhance the exciton generation probability in the second light-emitting layer. Accordingly, the light-emitting efficiency of the second light-emitting layer can be enhanced. In addition, due to transfer of energy of excitations generated in the second light-emitting layer, light emission can be efficiently achieved also in the first light-emitting layer and the third light-emitting layer.

A light-emitting element according to a tenth aspect of the disclosure is the light-emitting element according to any one of the first to ninth aspects, wherein the LUMO level of the material contained in the second light-emitting layer at least at the highest mixing ratio may be lower than the LUMO level of the material contained in the third light-emitting layer at least at the highest mixing ratio.

According to this configuration, when the negative electrode is provided on the third light-emitting layer side as the first or second electrode, electrons are more easily injected into the second light-emitting layer than the third first light-emitting layer. When the positive electrode is provided on the third light-emitting layer side as the first or second electrode, electrons are hardly leaked from the second light-emitting layer to the third light-emitting layer. Therefore, this configuration can enhance the exciton generation probability in the second light-emitting layer. Accordingly, the light-emitting efficiency of the second light-emitting layer can be enhanced. In addition, due to transfer of energy of excitations generated in the second light-emitting layer, light emission can be efficiently achieved also in the first light-emitting layer and the third light-emitting layer.

A light-emitting element according to an eleventh aspect of the disclosure is the light-emitting element according to any one of the first to tenth aspects, wherein the first light-emitting layer may have a thickness of less than 5 nm, and the content of the TTF material in the first light-emitting layer may be greater than 50%.

In this configuration, the first light-emitting layer is an extremely thin layer containing the TTF material at a high content. Therefore, the Dexter energy transfer from the excited triplet level of the thermally activated delayed fluorescent material in the second light-emitting layer to the excited triplet level of the TTF material in the first light-emitting layer is likely to occur. Therefore, light emission can be more efficiently achieved in the first light-emitting layer.

A light-emitting element according to a twelfth aspect of the disclosure is the light-emitting element according the eleventh aspect, wherein the functional layer may contain at least a layer layered on a side opposite to the second light-emitting layer with the first light-emitting layer interposed between the second light-emitting layer and the functional layers, and the HOMO level of a material contained in the layer on the first light-emitting layer, of the layer layered on a side opposite to the second light-emitting layer with the first light-emitting layer interposed between the second light-emitting layer and the functional layers, may be lower than the HOMO level of the material contained in the second light-emitting layer at least at the highest mixing ratio.

When the thickness of the first light-emitting layer is small, the first light-emitting layer has an island shape. The first light-emitting layer may be in direct contact with a layer layered on a side opposite to the second light-emitting layer with the first light-emitting layer interposed between the second light-emitting layer and the layer. However, according to this configuration, holes are hardly leaked from the second light-emitting layer to the layer layered on the side opposite to the second light-emitting layer with the first light-emitting layer interposed between the second light-emitting layer and the layer. Carriers can be trapped by an interface between the second light-emitting layer and the layer layered on the side opposite to the second light-emitting layer with the first light-emitting layer interposed between the second light-emitting layer and the layer.

A light-emitting element according to a thirteenth aspect of the disclosure is the light-emitting element according the eleventh aspect, wherein the functional layer may contain at least a layer layered on a side opposite to the second light-emitting layer with the first light-emitting layer interposed between the second light-emitting layer and the functional layers, and the LUMO level of a material contained in the layer on the first light-emitting layer, of the layer layered on a side opposite to the second light-emitting layer with the first light-emitting layer interposed between the second light-emitting layer and the functional layers, may be higher than the LUMO level of the material contained in the second light-emitting layer at least at the highest mixing ratio.

When the thickness of the first light-emitting layer is small, the first light-emitting layer has an island shape. The first light-emitting layer may be in direct contact with a layer layered on a side opposite to the second light-emitting layer with the first light-emitting layer interposed between the second light-emitting layer and the layer. However, according to this configuration, electrons are hardly leaked from the second light-emitting layer to the layer layered on the side opposite to the second light-emitting layer with the first light-emitting layer interposed between the second light-emitting layer and the layer. Carriers can be trapped by an interface between the second light-emitting layer and the layer layered on the side opposite to the second light-emitting layer with the first light-emitting layer interposed between the second light-emitting layer and the layer.

A light-emitting element according to a fourteenth aspect of the disclosure is the light-emitting element according to any one of the first to thirteenth aspects, wherein a buffer layer containing no fluorescent material may be provided between the second light-emitting layer and the third light-emitting layer.

Transfer of excitation energy between the second light-emitting layer and the third light-emitting layer is caused by Förster energy transfer that does not need direct contact. Therefore, the buffer layer containing no fluorescent material may be provided between the second light-emitting layer and the third light-emitting layer.

When the buffer layer is provided, a difference of carrier (hole or electron) mobility and the size of barrier between the second light-emitting layer and the third light-emitting layer can be changed, and the carrier balance can be controlled. According to this configuration, excitons can be certainly generated in the second light-emitting layer. Therefore, the light-emitting efficiency of each layer can be enhanced.

A light-emitting element according to a fifteenth aspect of the disclosure is the light-emitting element according to fourteenth aspect, wherein the total thickness of the second light-emitting layer and the buffer layer may be not greater than 20 nm.

A Förster transition from the $S_1$ level of the thermally activated delayed fluorescent material contained in the second light-emitting layer to the $S_1$ level of the fluorescent material contained in the third light-emitting layer occurs when the materials are within a constant distance without direct contact. When light-emitting layers having different emission peak wavelengths are layered, excitation energy is easily transferred from the light-emitting layer having the shorter emission peak wavelength to the light-emitting layer exhibiting the longer emission peak wavelength. When a distance between a molecule of the thermally activated delayed fluorescent material and a molecule of the fluorescent material is not greater than 20 nm, the Förster transition easily and certainly occurs, and the energy transfer efficiency is not deteriorated. When the buffer layer is provided between the second light-emitting layer and the third light-emitting layer, it is preferable that the total thickness of the second light-emitting layer and the buffer layer be not greater than 20 nm.

A light-emitting element according to a sixteenth aspect of the disclosure is the light-emitting element according to any one of the first to fifteenth aspects, wherein the first light-emitting layer may be a blue light-emitting layer, the second light-emitting layer may be a green light-emitting layer, and the third light-emitting layer may be a red light-emitting layer.

According to this configuration, each of the blue light-emitting layer, the green light-emitting layer, and the red light-emitting layer can be made to efficiently emit light. Therefore, a white light-emitting element having high light-emitting efficiency can be provided.

A light-emitting element according to a seventeenth aspect of the disclosure may be an organic EL element that is the light-emitting element according to any one of the first to sixteenth aspects.

According to this configuration, an organic EL element having high light-emitting efficiency can be provided.

An electronic device (the organic EL display device 100) according to an eighteenth aspect of the disclosure may be provided with the light-emitting element (the organic EL element 10) according to any one of the first to seventeenth aspects.

According to this configuration, an electronic device provided with a light-emitting element having high light-emitting efficiency can be provided.

An electronic device according to a nineteenth aspect of the disclosure may be an illumination device that is the electronic device according to the eighteenth aspect.

According to this configuration, an illumination device having high light-emitting efficiency can be provided.

An electronic device according to a twentieth aspect of the disclosure may be a display device that is the electronic device according to any one of the first to seventh aspects.

According to this configuration, a display device having high light-emitting efficiency can be provided.

A method for manufacturing a light-emitting element (the organic EL element 10) according to a twenty-first aspect of the disclosure includes forming a functional layer (the organic EL layer 3) containing at least a light-emitting layer (the light-emitting layer 33) between a first electrode (one of the positive electrode 2 and the negative electrode 4) and a second electrode (the other of the positive electrode 2 and the negative electrode 4). In the method, the forming the functional layer includes forming a first light-emitting layer (the first light-emitting layer 33a), forming a second light-emitting layer (the second light-emitting layer 33b), and forming a third light-emitting layer (the third light-emitting layer 33c). The first light-emitting layer has the shortest emission peak wavelength of the light emitting layers and contains (I) a host material and (II) a TTF material that is a delayed fluorescent material that causes a TTF phenomenon in cooperation with the host material or by the TTF material alone, or at least the TTF material. The second light-emitting layer contains at least a thermally activated delayed fluorescent material, and the excited triplet level of the thermally activated delayed fluorescent material is higher than the excited triplet level of at least one of the host material and the TTF material contained in the first light-emitting layer. The third light-emitting layer has the longest emission peak wavelength of the light emitting layers and contains at least a fluorescent material. The formation of the first light-emitting layer and the formation of the second light-emitting layer are continuously performed such that the second light-emitting layer is layered between the first light-emitting layer and the third light-emitting layer and the first light-emitting layer and the second light-emitting layer are adjacent to each other.

According to the method, the same effects as those in the first aspect can be obtained.

A light emission method according to a twenty-second aspect of the disclosure includes transferring the energy of excitons generated in a second light-emitting layer (the second light-emitting layer 33b) containing at least a thermally activated delayed fluorescent material to a first light-emitting layer (the first light-emitting layer 33a) by Dexter energy transfer, transferring the energy of excitons generated in the second light-emitting layer to a third light-emitting layer (the third light-emitting layer 33c) by Förster energy transfer to make the first, second, and third light-emitting layers to emit light. The first light-emitting layer is layered on the second light-emitting layer, has an emission peak wavelength shorter than an emission peak wavelength of the second light-emitting layer, and contains a host material and a TTF material that is a delayed fluorescent material that causes a TTF phenomenon in cooperation with the host material or by the TTF material alone, or at least the TTF material, the excited triplet level of at least one of the host material and the TTF material is lower than the excited triplet level of the thermally activated delayed fluorescent material. The third light-emitting layer is layered on the second light-emitting layer on a side opposite to the first light-emitting layer, has an emission peak wavelength longer than an emission peak wavelength of the second light-emitting layer, and contains at least the fluorescent material.

According to the method, the same effects as those in the second aspect can be obtained.

The light emission method according to a twenty-third aspect of the disclosure may be the light emission method according to the twenty-second aspect, wherein the Dexter energy transfer from the excited triplet level of the thermally activated delayed fluorescent material in the second light-emitting layer to the excited triplet level of the TTF material in the first light-emitting layer occurs, re-excitation from the excited triplet level of the TTF material to the excited singlet level of the TTF material occurs, the Förster energy transfer from the excited singlet level of the thermally activated delayed fluorescent material in the second light-emitting layer to the excited singlet level of the fluorescent material in the third light-emitting layer occurs, and light emission is achieved in each of the first light-emitting layer, the second light-emitting layer, and third light-emitting layer.

According to the method, the same effects as those in the third aspect can be obtained.

REFERENCE SIGNS LIST

1 Substrate
2 Positive electrode
3 Organic EL layer (functional layer)
4 Negative electrode
5 Sealing body
6 Filling material
10 Organic EL element
11 Signal line
12 TFT
13 Interlayer insulating film
13a Contact hole
15 Edge cover
15a Opening
21 Non-translucent electrode
22 Light-transmitting electrode
30 Light-emitting region
31 Hole injecting layer
32 Hole transport layer
33 Light-emitting layer
33a First light-emitting layer
33b Second light-emitting layer
33c Third light-emitting layer
34 Electron transport layer
35 Electron injecting layer 36 Buffer layer
51R, 51G, 51B CF
100 Organic EL display device

The invention claimed is:

1. A light-emitting element comprising;
a first electrode;
a second electrode; and
a functional layer containing at least a first light-emitting layer and a second light-emitting layer, the functional layer being disposed between the first electrode and the second electrode, wherein
the first light-emitting layer has an emission peak wavelength shorter than an emission peak wavelength of the second light-emitting layer, and contains a host material and a triplet-triplet-fusion (TTF) material or at least the TTF material, the TTF material being a delayed fluorescent material that causes a TTF phenomenon by the TTF material alone or in cooperation with the host material,
the second light-emitting layer is adjacent to the first light-emitting layer, and contains at least a thermally activated delayed fluorescent material, the thermally activated delayed fluorescent material being a delayed fluorescent material in which reverse intersystem crossing occurs from an excited triplet level to an excited singlet level by thermal activation, and
an excited triplet level of at least one of the host material and the TTF material contained in the first light-emitting layer is lower than the excited triplet level of the thermally activated delayed fluorescent material contained in the second light-emitting layer.

2. The light-emitting element according to claim 1, wherein
energy of excitons generated in the second light-emitting layer is transferred to the first light-emitting layer due to a Dexter energy transfer, and
each of the first light-emitting layer and the second light-emitting layer emits light.

3. The light-emitting element according to claim 2, wherein
the Dexter energy transfer occurs from the excited triplet level of the thermally activated delayed fluorescent material in the second light-emitting layer to an excited triplet level of the TTF material in the first light-emitting layer, and
re-excitation occurs from the excited triplet level of the TTF material to an excited singlet level of the TTF material.

4. The light-emitting element according to claim 1, wherein the second light-emitting layer has a thickness of not greater than 20 nm.

5. The light-emitting element according to claim 1, wherein
the first electrode includes a positive electrode,
the first light-emitting layer, the second light-emitting layer, and a third light-emitting layer are layered in this order from a first electrode side,
the first light-emitting layer contains a material having a hole mobility higher than an electron mobility,
the second light-emitting layer contains a material having an electron mobility higher than a hole mobility, and
the third light-emitting layer contains a material having an electron mobility higher than a hole mobility.

6. The light-emitting element according to claim 1, wherein
the first electrode is a negative electrode,
the first light-emitting layer, the second light-emitting layer, and a third light-emitting layer are layered in this order from a first electrode side,
the first light-emitting layer contains a material having an electron mobility higher than a hole mobility,
the second light-emitting layer contains a material having a hole mobility higher than an electron mobility, and
the third light-emitting layer contains a material having a hole mobility higher than an electron mobility.

7. The light-emitting element according to claim 1, wherein a highest occupied molecular orbital (HOMO) level of a material contained in the second light-emitting layer at least at a highest mixing ratio is higher than a HOMO level of a material contained in the first light-emitting layer at least at the highest mixing ratio.

8. The light-emitting element according to claim 1, wherein a lowest unoccupied molecular orbital (LUMO) level of a material contained in the second light-emitting layer at least at the highest mixing ratio is lower than a LUMO level of a material contained in the first light-emitting layer at least at the highest mixing ratio.

9. The light-emitting element according to claim 1, wherein
the first light-emitting layer has a thickness of less than 5 nm, and
the second light-emitting layer has a thickness which is not greater than 20 nm.

10. The light-emitting element according to claim 9, wherein
the functional layer contains at least one layer on the first light-emitting layer such that the first light-emitting layer is interposed between the second light-emitting layer and the at least one layer,
the at least one layer contains a fourth layer on the first light-emitting layer such that the first light-emitting layer is interposed between the second light-emitting layer and the fourth layer, and
a highest occupied molecular orbital (HOMO) level of a material contained in the fourth layer is lower than a HOMO level of a material contained in the second light-emitting layer at least at a highest mixing ratio.

11. The light-emitting element according to claim 9, wherein
the functional layer contains at least one layer on the first light-emitting layer such that the first light-emitting layer is interposed between the second light-emitting layer and the at least one layer,
the at least one layer contains a fourth layer on the first light-emitting layer such that the first light-emitting layer is interposed between the second light-emitting layer and the fourth layer, and
a lowest unoccupied molecular orbital (LUMO) level of a material contained in the fourth layer is higher than a LUMO level of a material contained in the second light-emitting layer at least at a highest mixing ratio.

12. The light-emitting element according to claim 1, wherein
the first light-emitting layer contains the host material,
the excited triplet level of the host material contained in the first light-emitting layer is higher than the excited triplet level of the TFT material, and
the host material contained in the first light-emitting layer has a hole mobility higher than an electron mobility.

13. The light-emitting element according to claim 1, wherein the second light-emitting layer contains a host material, an excited triplet level of the host material contained in the second light-emitting layer is higher than the excited triplet level of the thermally activated delayed fluorescent material, and the host material contained in the second light-emitting layer has an electron mobility higher than a hole mobility.

14. The light-emitting element according to claim 1, wherein a content of the TTF material in the first light-emitting layer and a content of the thermally activated delayed fluorescent material in the second light-emitting layer are not less than 10 wt %, respectively.

15. A display device comprising a plurality of the light-emitting elements recited in claim 1, the display device further comprising:
(i) a first pixel being provided with one of the plurality of the light-emitting elements, the first pixel emits light of a first color, and
(ii) a second pixel being provided with another one of the plurality of the light-emitting elements, the second pixel emits light of a second color which is different from the first color, wherein
the one of the plurality of the light-emitting elements and the another one of the plurality of the light-emitting elements emits a same monochromatic light,
the first pixel modulates the monochromatic light into the first color, and
the second pixel modulates the monochromatic light into the second color.

16. The display device according to claim 15, wherein
the first pixel includes a first color filter that transmits the light of the first color, and
the second pixel includes a second color filter that transmits the light of the second color.

17. The display device according to claim 16, wherein
the first color is red and the second color is green, and
the display device further including a third pixel that emits blue light.

18. A method for manufacturing a light-emitting element comprising:
forming a functional layer containing at least a light-emitting layer between a first electrode and second electrode, wherein
the forming of the functional layer includes forming a first light-emitting layer, and forming a second light-emitting layer,
the first light-emitting layer has an emission peak wavelength shorter than an emission peak wavelength of the second light-emitting layer, and contains a host material and a triplet-triplet-function (TTF) material or at least the TTF material, the TTF material being a delayed fluorescent material that causes a TTF phenomenon by the TTF material alone or in cooperation with the host material, the second light-emitting layer contains at least a thermally activated delayed fluorescent material, the thermally activated delayed fluorescent material being a material in which reverse intersystem crossing occurs from an excited triplet level to an excited singlet level by thermal activation, the excited triplet level of the thermally activated delayed fluorescent material is higher than an excited triplet level of at least one of the host material and the TTF material contained in the first light-emitting layer, and the forming of the first light-emitting layer and the forming of the second light-emitting layer are continuously performed such that the first light-emitting layer and the second light-emitting layer are adjacent to each other.

19. A light emission method comprising:

transferring energy of excitons generated in a second light-emitting layer containing at least a thermally activated delayed fluorescent material to a first light-emitting layer by Dexter energy transfer, the thermally activated delayed fluorescent material being a delayed fluorescent material in which reverse intersystem crossing occurs from an excited triplet level to an excited singlet level by thermal activation to make the first light-emitting layer and the second light-emitting layer, wherein the first light-emitting layer is layered on the second light-emitting layer, has an emission peak wavelength shorter than an emission peak wavelength of the second light-emitting layer, and contains a host material and a triplet-triplet-function (TTF) material or at least the TTF material, the TTF material being a delayed fluorescent material that cause a TTF phenomenon by the TTF material alone or in cooperation with the host material, and an excited triplet level of at least one of the host material and the TTF material is lower than the excited triplet level of the thermally activated delayed fluorescent material.

20. The light emission method according to claim 19, wherein
the Dexter energy transfer occurs from the excited triplet level of the thermally activated delayed fluorescent material in the second light-emitting layer to an excited triplet level of the TTF material in the first light-emitting layer, re-excitation occurs from the excited triplet level of the TTF material to an excited singlet level of the TTF material, and each of the first light-emitting layer and the second light-emitting layer emits light.

* * * * *